US010672446B2

(12) United States Patent
Shibata et al.

(10) Patent No.: US 10,672,446 B2
(45) Date of Patent: Jun. 2, 2020

(54) EXCHANGE BIAS UTILIZATION TYPE MAGNETIZATION ROTATIONAL ELEMENT, EXCHANGE BIAS UTILIZATION TYPE MAGNETORESISTANCE EFFECT ELEMENT, EXCHANGE BIAS UTILIZATION TYPE MAGNETIC MEMORY, NON-VOLATILE LOGIC CIRCUIT, AND MAGNETIC NEURON ELEMENT

(71) Applicant: TDK CORPORATION, Tokyo (JP)

(72) Inventors: Tatsuo Shibata, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/079,436

(22) PCT Filed: Jun. 9, 2017

(86) PCT No.: PCT/JP2017/021518
§ 371 (c)(1),
(2) Date: Aug. 23, 2018

(87) PCT Pub. No.: WO2017/213261
PCT Pub. Date: Dec. 14, 2017

(65) Prior Publication Data
US 2019/0035446 A1 Jan. 31, 2019

(30) Foreign Application Priority Data

Jun. 10, 2016 (JP) .................................. 2016-116677
Dec. 2, 2016 (JP) .................................. 2016-235454

(51) Int. Cl.
*G11C 11/00* (2006.01)
*G11C 11/15* (2006.01)
(Continued)

(52) U.S. Cl.
CPC .............. *G11C 11/15* (2013.01); *G11C 11/16* (2013.01); *G11C 11/161* (2013.01);
(Continued)

(58) Field of Classification Search
CPC ....... G11C 11/15; G11C 11/16; G11C 11/161; G11C 11/1673; G11C 11/1675; H01L 27/105; H01L 29/82
(Continued)

(56) References Cited

U.S. PATENT DOCUMENTS

2010/0237317 A1 9/2010 Tsunoda
2010/0254183 A1 10/2010 Fukami et al.
(Continued)

FOREIGN PATENT DOCUMENTS

EP 2267734 A1 * 12/2010
EP 3001470 A1 3/2016
(Continued)

OTHER PUBLICATIONS

P.Wadley, "Electrical Switching of an Antiferromagenet", Science vol. 351 pp. 587-590. 2016.
(Continued)

*Primary Examiner* — Huan Hoang
(74) *Attorney, Agent, or Firm* — Oliff PLC

(57) ABSTRACT

An exchange bias utilization type magnetization rotational element includes an anti-ferromagnetic driving layer which is made of first region and second region anti-ferromagnetisms, and a third region anti-ferromagnetism positioned between the first and second regions, a magnetic coupling layer anti-ferromagnetism which is magnetically coupled to the anti-ferromagnetic driving layer anti-ferromagnetism in the third region anti-ferromagnetism, a first electrode layer anti-ferromagnetism which is bonded to the first region anti-ferromagnetism; and a second electrode layer anti-
(Continued)

ferromagnetism which is bonded to the second region antiferromagnetism.

20 Claims, 13 Drawing Sheets

(51) Int. Cl.
| | |
|---|---|
| *H01L 43/08* | (2006.01) |
| *H01L 43/10* | (2006.01) |
| *H01L 29/82* | (2006.01) |
| *G11C 11/16* | (2006.01) |
| *H01L 21/8239* | (2006.01) |
| *H01L 27/105* | (2006.01) |
| *H01L 27/22* | (2006.01) |

(52) U.S. Cl.
CPC ...... *G11C 11/1673* (2013.01); *G11C 11/1675* (2013.01); *H01L 21/8239* (2013.01); *H01L 27/105* (2013.01); *H01L 29/82* (2013.01); *H01L 43/08* (2013.01); *H01L 43/10* (2013.01); *H01L 27/226* (2013.01)

(58) Field of Classification Search
USPC ........................................................ 365/158
See application file for complete search history.

(56) References Cited

U.S. PATENT DOCUMENTS

| | | | |
|---|---|---|---|
| 2011/0017938 A1* | 1/2011 | Akai ................. | H01F 1/408 252/62.51 C |
| 2011/0129691 A1 | 6/2011 | Ishiwata et al. | |
| 2012/0313191 A1* | 12/2012 | Whig ................. | H01L 43/08 257/421 |
| 2014/0169084 A1* | 6/2014 | Wunderlich ........... | H01L 43/02 365/158 |
| 2014/0268987 A1 | 9/2014 | Annunziata et al. | |
| 2016/0247550 A1 | 8/2016 | Fukami et al. | |
| 2018/0019388 A1 | 1/2018 | Fukami et al. | |

FOREIGN PATENT DOCUMENTS

| | | |
|---|---|---|
| JP | 2015-088669 A | 5/2015 |
| JP | 2016-004924 A | 1/2016 |
| WO | 2009/054180 A1 | 4/2009 |
| WO | 2009/072213 A1 | 6/2009 |
| WO | 2009/101827 A1 | 8/2009 |
| WO | 2010/038823 A1 | 4/2010 |
| WO | 2015/068509 A1 | 5/2015 |
| WO | 2016/159017 A1 | 10/2016 |

OTHER PUBLICATIONS

T. Shiino et.al., "Antiferromagnetic Domain Wall Motion Driven by Spin-Orbit Torques", Phys.Rev.Lett., vol. 117, pp. 087203-1-087203-6. 2016.
S. Fukami et al., "Magnetization Switching by Spin-Orbit Torque in an Antiferromagnet-ferromagnet bilayer system", nature materials, vol. 15, pp. 535-542, (2016).
Helen V. Gomonay et al., "Spin Transfer and current induced switching in antiferromagents", Physical Review B, vol. 81, 144427, 2010.
J. Čelezný et al., "Relativistic Néel-Order Fields Induced by Electrical Current in Antiferromagnets", Physical Review Letters, vol. 113, pp. 157201-1 to 157201-5, 2014.
M Jourdan et al., "Epitaxial Mn2Au Thin films for antiferromagnetic spintronics", Journal of Physics D: Applied Physics, vol. 48, 385001, pp. 1-5, 2015.
P. Wadley et al., "Tetragonal phase of epitaxial room-temperature antiferromagnet CuMnAs", Nature Communications, vol. 4, 2322, pp. 1-6, 2013.
V.M.T.S. Barthem et al., "Revealing the properties of Mn2Au for antiferromagnetic spintronics", Nature Communications, vol. 4, 2892, pp. 1-7, 2013.
O. Gomonay et al., "Staggering Antiferromagnetic domain wall velocity in a staggered spin-orbit field", Physical Review Letters, vol. 117, 017202, pp. 1-9, 2016.
Aug. 15, 2017, International Search Report issued in International Patent Application No. PCT/JP2017/021518.

* cited by examiner

EXCHANGE BIAS UTILIZATION TYPE MAGNETIZATION ROTATIONAL ELEMENT, EXCHANGE BIAS UTILIZATION TYPE MAGNETORESISTANCE EFFECT ELEMENT, EXCHANGE BIAS UTILIZATION TYPE MAGNETIC MEMORY, NON-VOLATILE LOGIC CIRCUIT, AND MAGNETIC NEURON ELEMENT

TECHNICAL FIELD

The present invention relates to an exchange bias utilization type magnetization rotational element, an exchange bias utilization type magnetoresistance effect element, an exchange bias utilization type magnetic memory, a non-volatile logic circuit, and a magnetic neuron element.

This application claims priority based on Japanese Patent Application No. 2016-116677 filed in Japan on Jun. 10, 2016, and Japanese Patent Application No. 2016-235454 filed in Japan on Dec. 2, 2016, the entire content of which is incorporated herein by reference.

BACKGROUND ART

As a next generation non-volatile memory to replace flash memories and the like which have limits on a decrease in size, resistance change type memories using a resistance change type element, such as a magnetoresistive random access memory (MRAM), a resistance random access memory (ReRAM), and a phase change random access memory (PCRAM), have attracted an attention.

As a method of increasing a density of a memory (increasing capacity), in addition to a method of decreasing the size of elements themselves constituting the memory, there is a method of converting a recording bit per element into multiple values, and various multivalue methods have been proposed (for example, Patent Documents 1 to 3).

One type of MRAM is referred to as a magnetic domain wall drive type or a magnetic domain wall move type (for example, Patent Document 4). The magnetic domain wall drive type MRAM performs data writing by causing a current to flow in an in-plane direction of the magnetic domain wall driving layer (magnetization free layer), moving a magnetic domain wall using a spin transfer effect by spin-polarized electrons, and reversing magnetization of a ferromagnetic film to a direction of a write current.

In Patent Document 4, methods of multivalue recording and analog recording for a magnetic domain wall drive type MRAM are described.

For MRAMs, different data writing methods have been proposed. For example, in addition to the magnetic domain wall drive type MRAM, a magnetic field writing type MRAM, a yoke magnetic field writing type MRAM, a spin transfer torque (STT) type MRAM, a spin orbit torque (SOT) type MRAM, and the like are known.

CITATION LIST

Patent Literature

[Patent Document 1]
 Japanese Unexamined Patent Application, First Publication No. 2015-088669
[Patent Document 2]
 PCT International Publication No. WO2009/072213
[Patent Document 3]
 Japanese Unexamined Patent Application, First Publication No. 2016-004924
[Patent Document 4]
 PCT International Publication No. WO2009/101827
[Patent Document 5]
 PCT International Publication No. WO2009/054180

Non Patent Literature

[Non-Patent Document 1]
 P. Wadley, Science 351 (2016) 587.
[Non-Patent Document 2]
 T. Shiino et. Al., Phys. Rev. Lett. 117, 087203 (2016).

SUMMARY OF INVENTION

Technical Problem

However, in a conventional magnetic domain wall drive type MRAM, it is necessary to cause a current to flow in an in-phase direction of a magnetic domain wall driving layer (a magnetization free layer) at the time of reading. For this reason, there is a possibility that a magnetic domain wall of the magnetic domain wall driving layer may move due to the current flowing at the time of reading. If the magnetic domain wall moves further outside than a portion in which the magnetic domain wall driving layer (magnetization free layer) overlaps a magnetoresistance effect element, a signal finally becomes a digital signal of 0 or 1 in the magnetic domain wall drive type MRAM, and thus it is difficult to use the magnetic domain wall drive type MRAM as an analog memory. On the other hand, if the magnetic domain wall is not completely moved further outside than the portion in which the magnetic domain wall driving layer (magnetization free layer) overlaps the magnetoresistance effect element in a plan view, there are problems that the magnetic domain wall moves at the time of reading and performs erroneous writing or reading to change an initial signal, and the like.

In addition, in the magnetic domain wall drive type MRAM, since the magnetic domain wall is used for recording information, if an external magnetic field is applied to an element, there is a problem that recorded information may disappear.

The present invention has been made in view of the above circumstances, and an object thereof is to provide an exchange bias utilization type magnetization rotational element, an exchange bias utilization type magnetoresistance effect element, and an exchange bias utilization type magnetic memory which have high environmental resistance with respect to an external magnetic field and can stably read analog recording data.

Solution to Problem

The present invention provides the following means to solve the above problems.

(1) An exchange bias utilization type magnetization rotational element according to one aspect of the present invention includes an anti-ferromagnetic driving layer which is made of a first region, a second region, and a third region positioned between the first and second regions, a magnetic coupling layer which is magnetically coupled to the anti-ferromagnetic driving layer in the third region and whose magnetization direction is variable, a first electrode layer which is bonded to the first region, and a second electrode layer which is bonded to the second region.

(2) In the exchange bias utilization type magnetization rotational element according to (1) described above, the anti-ferromagnetic driving layer may include an anti-ferromagnetic material having a zinc-blende structure.

(3) In the exchange bias utilization type magnetization rotational element according to (1) described above, the anti-ferromagnetic driving layer may include an anti-ferromagnetic material of any one of CuMnAs and Mn2Au.

(4) In the exchange bias utilization type magnetization rotational element according to (1) described above, the anti-ferromagnetic driving layer may include, from a side bonded to the magnetic coupling layer, an anti-ferromagnetic layer and a non-magnetic metal layer which is bonded to the anti-ferromagnetic layer and in which a pure spin current is generated by a current flowing therein.

(5) The exchange bias utilization type magnetization rotational element according to any one of (1) to (4) described above may further include a lower electrode layer provided at a position overlapping the magnetic coupling layer in a plan view on a surface of the third region which is opposite to a surface on which the magnetic coupling layer is provided.

(6) In the exchange bias utilization type magnetization rotational element according to (5) described above, a high resistance layer may be provided between the anti-ferromagnetic driving layer and the lower electrode layer.

(7) In the exchange bias utilization type magnetization rotational element according to any one of (1) to (6) described above, when a constant load amount for changing a ratio of two types of domains such as the first domain and the second domain is given, the anti-ferromagnetic driving layer may be made of a material in which a change rate of the ratio with respect to the load amount discontinuously changes in the vicinity of both ends of only the first domain or the second domain.

(8) In the exchange bias utilization type magnetization rotational element according to any one of (1) to (6) described above, when a constant load amount for changing a ratio of two types of domains such as a first domain and a second domain is given, the anti-ferromagnetic driving layer may be made of a material in which a change rate of the ratio with respect to the load amount in the vicinity of both ends of only a first domain or a second domain is smaller than a change rate between both ends.

(9) In the exchange bias utilization type magnetization rotational element according to any one of (1) to (8) described above, the first electrode layer and the second electrode layer bonded to the anti-ferromagnetic driving layer may be made of ferromagnetic materials having magnetization directions opposite to each other.

(10) in the exchange bias utilization type magnetization rotational element according to (9) described above, at least one of the first electrode layer and the second electrode layer bonded to the anti-ferromagnetic driving layer may be made of a synthetic anti-ferromagnetic structure in which a first ferromagnetic layer, an intermediate layer and a second ferromagnetic layer are laminated.

(11) In the exchange bias utilization type magnetization rotational element according to any one of (1) to (10) described above, a length of a major axis of the anti-ferromagnetic driving layer may be 60 nm or more, and a distance between a portion of the first electrode layer which is closest to the magnetic coupling layer and a portion of the second electrode layer which is closest to the magnetic coupling layer may be 60 nm or more.

(12) An exchange bias utilization type magnetoresistance effect element according to another aspect of the present invention includes the exchange bias utilization type magnetization rotational element according to any one of (1) to (11) described above, a non-magnetic layer bonded to the magnetic coupling layer, and a magnetization fixed layer coupled to the non-magnetic layer.

(13) In the exchange bias utilization type magnetoresistance effect element according to (12) described above, a magnetization easy axis of the magnetic coupling layer and the magnetization fixed layer may be perpendicular to a lamination direction.

(14) In the exchange bias utilization type magnetoresistance effect element according to (12) or (13) described above, the magnetic coupling layer may have a laminated structure including a magnetoresistance effect layer and a soft magnetic layer in order from the side of the non-magnetic layer, and the magnetoresistance effect layer may be made of a material containing CoFeB.

(15) In the exchange bias utilization type magnetoresistance effect element according to any one of (12) to (14) described above, a bipolar element may be connected to any one of the first electrode layer and the second electrode layer.

(16) An exchange bias utilization type magnetic memory according to still another aspect of the present invention includes a plurality of the exchange bias utilization type magnetoresistance effect elements according to any one of (12) to (15) described above.

(17) The exchange bias utilization type magnetic memory according to (16) described above may further include a mechanism configured to read a resistance change between the magnetization fixed layer and a lower electrode layer provided at a position overlapping the magnetic coupling layer in a plan view on a surface of the third region which is opposite to a surface on which the magnetic coupling layer is provided at the time of reading.

(18) A non-volatile logic circuit according to still another aspect of the present invention includes an exchange bias utilization type magnetic memory in which the exchange bias utilization type magnetoresistance effect elements according to any one of (12) to (15) described above are arranged in an array shape, and an STT-MRAM, in which a storage function and a logic function are included and the exchange bias utilization type magnetic memory and the STT-MRAM are included for the storage function.

(19) A magnetic neuron element according to still another aspect of the present invention includes the exchange bias utilization type magnetoresistance effect element according to any one of (12) to (15) described above, the third region of the anti-ferromagnetic driving layer aligned in a longitudinal direction and made of a first storage portion, and a second storage portion and the third storage portion which are across the first storage portion, and a current source having a control circuit for performing control such that a write current capable of sequentially moving the magnetic domain wall flows to stay at least once in each of the first storage portion, the second storage portion, and the third storage portion.

Advantageous Effects of Invention

According to the exchange bias utilization type magnetization rotational element, it is possible to provide an exchange bias utilization type magnetization rotational element, an exchange bias utilization type magnetoresistance effect element, and an exchange bias utilization type magnetic memory which have high environmental resistance to an external magnetic field and stably read analog recording data.

BRIEF DESCRIPTION OF DRAWINGS

FIG. 10A shows a case in which the anti-ferromagnetic driving layer is a nucleation type.

FIG. 10B shows a case in which the anti-ferromagnetic driving layer is a domain wall moving type.

DESCRIPTION OF EMBODIMENTS

Figure 1:
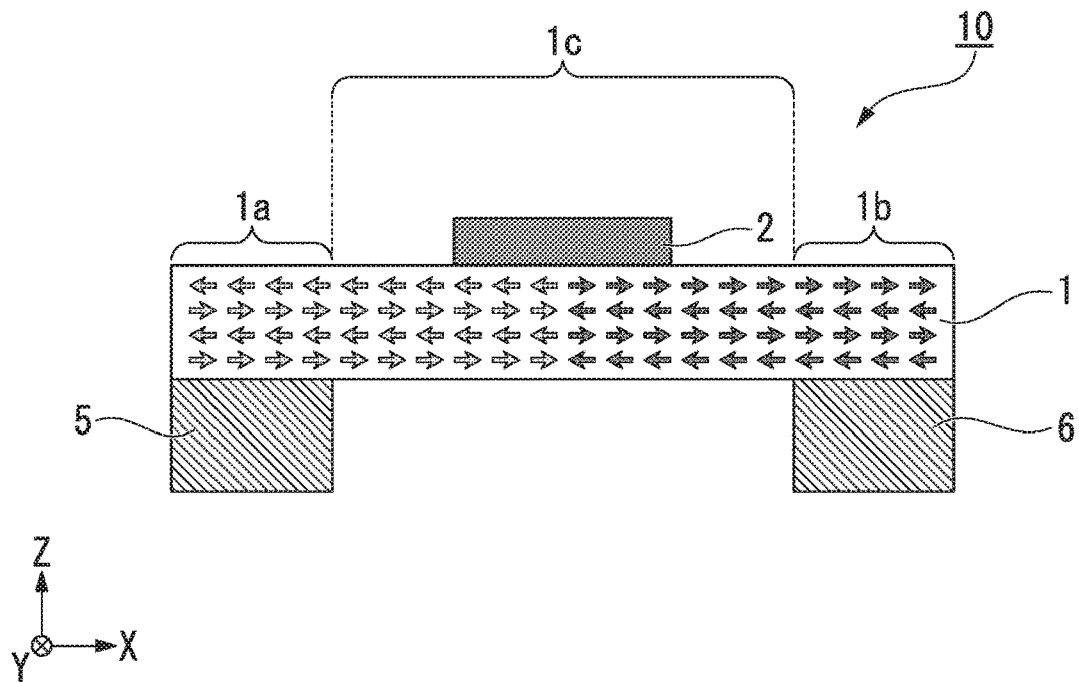
FIG. 1 is a schematic cross-sectional view of an example of an exchange bias utilization type magnetization rotational element according to an embodiment of the present invention.

Hereinafter, a configuration of the present invention will be described using drawings. In the drawings used in the following description, there is a case in which a characteristic portion is expanded for convenience to make characteristics easier to understand, and a dimensional ratio and the like of each component is not necessarily the same as in actual. In addition, the materials, dimensions, and the like in the following description are merely exemplary examples, but the present invention is not limited thereto, and appropriate changes can be made within a range of achieving the effect of the present invention. In the element of the present invention, other layers may be included as long as the effect of the present invention is achieved.

(Exchange Bias Utilization Type Magnetization Rotational Element)

FIG. 1 is a schematic cross-sectional view of an example of an exchange bias utilization type magnetization rotational element according to an embodiment of the present invention.

The exchange bias utilization type magnetization rotational element 10 shown in FIG. 1 includes an anti-ferromagnetic driving layer 1 which is made of a first region 1a, a second region 1b, and a third region 1c positioned between the first and second regions, a magnetic coupling layer 2 which is magnetically coupled to the anti-ferromagnetic driving layer 1 in the third region 1c and whose magnetization direction is variable, a first electrode layer 5 bonded to the first region 1a, and a second electrode layer 6 bonded to the second region 1b.

Here, the "anti-ferromagnetic driving layer" in the present invention is a layer in which a diamagnetic layer magnetically coupled to the magnetic coupling layer is included. In addition, the "anti-ferromagnetic driving layer" is not limited to being made of only a diamagnetic layer, but may also have a laminated structure made of the diamagnetic layer to be described below and a non-magnetic metal layer which causes a pure spin current to diffuse into the diamagnetic layer (refer to FIG. 3).

The anti-ferromagnetic driving layer 1 can have a configuration including an anti-ferromagnetic material having a zinc-blende structure (hereinafter referred to as "configuration A" in some cases). Since the anti-ferromagnetic material having a zinc-blende structure has broken space reversal symmetry of a crystal structure, it is a material whose space reversal symmetry and time reversal symmetry on magnetic symmetry are broken together. When such a material is used, it is possible to change a proportion (ratio) of two types of domains having different sublattice magnetization directions in the anti-ferromagnetic driving layer by causing a current to flow into the anti-ferromagnetic driving layer. As a result, a magnetization direction of a magnetic coupling layer formed thereon can be controlled.

The anti-ferromagnetic driving layer 1 can have a configuration including an abut-ferromagnetic material of one of CuMnAs and $Mn_2Au$ (hereinafter referred to as "configuration B" in some cases). Even though CuMnAs and $Mn_2Au$ have space reversal symmetry, since time and space reversal symmetry are broken in consideration of magnetic symmetry, it is possible to change a proportion of two types of domains having different sublattice magnetization directions in the anti-ferromagnetic driving layer by causing a current to flow into the anti-ferromagnetic driving layer. As a result, the magnetization direction of a magnetic coupling layer formed thereon can be controlled. In addition, since a magnetic transition temperature is higher than room temperature, the anti-ferromagnetic driving layer 1 can be used as a device that is driven at room temperature.

Figure 2:
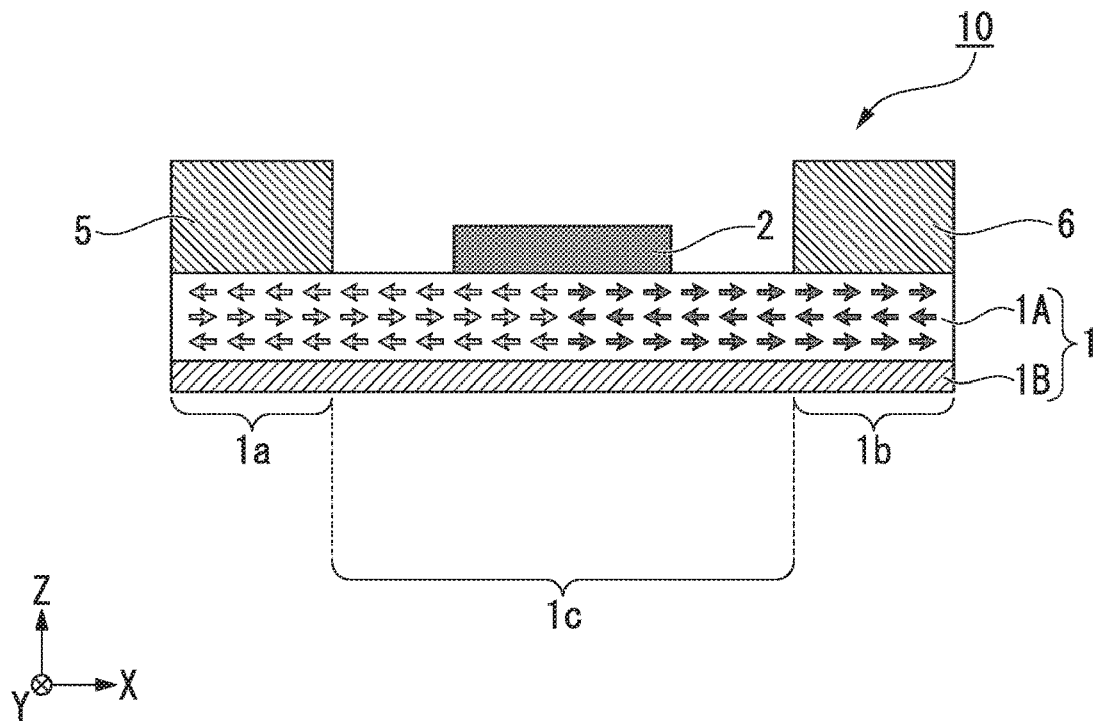
FIG. 2 is a schematic cross-sectional view of an example of an exchange bias utilization type magnetization rotational element according to another embodiment of the present invention.

The anti-ferromagnetic driving layer 1 can have, as shown in FIG. 2, a configuration including an anti-ferromagnetic layer 1A and a non-magnetic metal layer 1B that is bonded to the anti-ferromagnetic layer 1A and in which a pure spin current is generated by a flowing current from a side bonded to the magnetic coupling layer 2 (hereinafter referred to as "configuration C" in some cases). The non-magnetic metal layer 1B has a configuration in which a pure spin current is generated by a flowing current. Accordingly, a current is caused to flow into the non-magnetic metal layer 1B to generate a spin current, this spin current is injected into the anti-ferromagnetic layer 1A, and thereby the proportion of the two types of domains of the anti-ferromagnetic layer 1A changes, and the magnetization direction of a magnetic coupling layer formed thereon can be controlled.

The anti-ferromagnetic layer 1A requires a configuration in which spins are arranged such that domains with aligned spin directions are formed on a surface bonded to the magnetic coupling layer 2. This point will be described using FIG. 2. The spin directions are alternately reverse directions on a side surface of the anti-ferromagnetic layer 1A of FIG. 2, but if this side surface is a surface bonded to the magnetic coupling layer 2, a ratio of two types of domains cannot be changed. For this reason, as shown in FIG. 2, the anti-ferromagnetic layer 1A needs to have a configuration in which spins are arranged such that domains with aligned spin directions are formed on a surface bonded to the magnetic coupling layer 2 (to produce a crystal plane).

As a material of the anti-ferromagnetic layer 1A, in addition to the materials of configuration A and configuration B, alloys such as IrMn, PtMn, FeMn, NiMn, RhMn, PdPtMn, PtCrMn, PdMn, and the like, anti-ferromagnetic Heusler alloys such as $Pd_2MnGa$, $Mn_2VAl$, $Ni_2MnAl$, and MnN, or oxides such as NiO and $Fe_2O_3$ doped to have low resistance can be used.

It is preferable that the length of a major axis of the anti-ferromagnetic driving layer 1 be 60 nm or more, and a distance between a position of the first electrode layer 5 which is closest to the magnetic coupling layer 2 and a position of the second electrode layer 6 which is closest to the magnetic coupling layer 2 be 60 nm or more.

A wall thickness of a domain is about tens of nm, and this is because two or more domains can be included in the anti-ferromagnetic driving layer.

The non-magnetic metal layer 1B includes a material from which a pure spin current occurs (is generated) according to a spin Hall effect if a current flows. Any material that has a configuration in which a pure spin current is generated in the non-magnetic metal layer 1B is sufficient. Therefore, the material is not limited to a material composed of one single element, but may be a material composed of a part constituted by a material from which a pure spin current is generated and a part constituted by a material from which a pure spin current is not generated, and the like.

The spin Hall effect is a phenomenon in which a pure spin current is induced in a direction orthogonal to a current direction on the basis of a spin orbit interaction when a current flows through a material.

Figure 3:
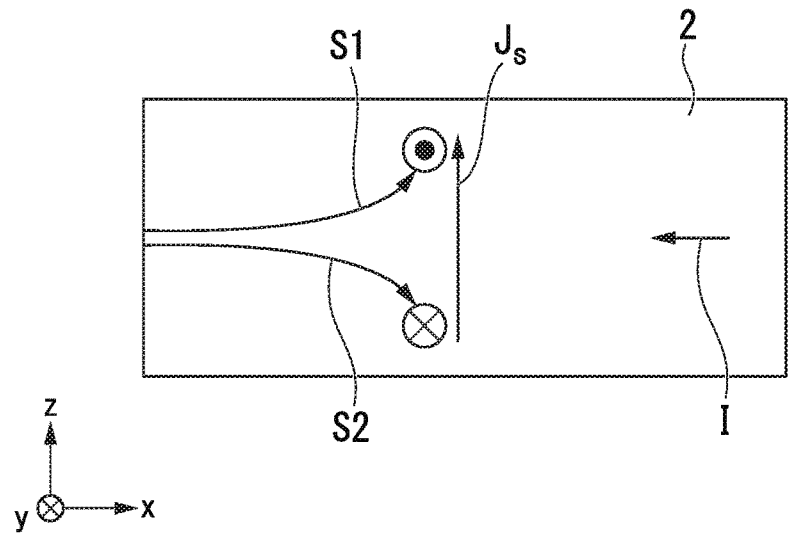
FIG. 3 is a schematic diagram showing a spin Hall effect.

FIG. 3 is a schematic diagram showing a spin Hall effect. A mechanism in which a pure spin current is generated by the spin Hall effect will be described with reference to FIG. 3.

As shown in FIG. 3, if a current I flows in a direction in which the non-magnetic metal layer 1B extends, each of an upward spin S+ and a downward spin S− is bent in a direction orthogonal to the current. A normal Hall effect and the spin Hall effect are common in that movement (moving) electric charges (electrons) are bent in a movement (moving) direction. On the other hand, they are greatly different in that the movement direction is bent once electrons move (once a current flows) even when there is no magnetic field in the spin Hall effect whereas charged particles moving in a magnetic field receive a Lorentz force to bend the movement direction in the normal Hall effect.

Since the number of electrons in upward spin $S^+$ is equal to the number of electrons in downward spin $S^-$ in a non-magnetic body (a material which is not a ferromagnetic body), the number of electrons in the upward spin $S^+$ facing upward is equal to the number of electrons in downward spin $S^-$ facing downward in FIG. 3. For this reason, a current which is a net flow of electric charges is zero. A spin current not accompanied by this current is specifically called a pure spin current.

On the other hand, even when a current flows in a ferromagnetic body, these two effects are the same in that the upward spin electrons and the downward spin electrons are bent in opposite directions. On the other hand, these two effects are different in that, since one of the upward spin electrons and the downward spin electrons is larger in number in the ferromagnetic body, the net flow of electric charges is generated as a result (a voltage is generated). Therefore, as the material of the non-magnetic metal layer 1B, a material made of only a ferromagnetic body is not included.

Here, if a flow of the upward spin $S^+$ is represented by $J_\uparrow$, a flow of the downward spin $S^-$ is represented by $J_\downarrow$, and a spin current is represented by $J_S$, it is defined that $J_S=J_\uparrow-J_\downarrow$. In FIG. 3, $J_S$ flows upward in the drawing as a pure spin current.

In FIG. 3, if the anti-ferromagnetic layer 1A is brought in contact with an upper surface of the non-magnetic metal layer 1B, a pure spin current diffuses into the anti-ferromagnetic layer 1A and flows.

With a configuration in which a pure spin current is generated by causing a current to flow into the non-magnetic metal layer 1B and the pure spin current diffuses into the anti-ferromagnetic layer 1A in contact with the non-magnetic metal layer 1B, a spin orbit torque (SOT) effect by this pure spin current contributes to control of the ratio of two types of domains.

The non-magnetic metal layer 1B may include a non-magnetic heavy metal. Here, "heavy metal" refers to a metal having a specific gravity equal to or more than that of yttrium. The non-magnetic metal layer 1B may be made of only a non-magnetic heavy metal.

In this case, it is preferable that the non-magnetic heavy metal be a non-magnetic metal with a large atomic number equal to or more than an atomic number 39 having d electrons or f electrons in the inner shell. This is because such a non-magnetic metal has a large spin orbit interaction causing a spin Hall effect. The non-magnetic metal layer 1B may be made of only a non-magnetic metal with a large atomic number equal to or more than the atomic number 39 having d electrons or f electrons in the inner shell. Normally, if a current is caused to flow into a metal, all the electrons move in a reverse direction to the current regardless of the spin direction. On the other hand, since the non-magnetic metal with a large atomic number having d electrons or f electrons in the inner shell has a large spin orbit interaction, a moving direction of electrons depends on a spin direction of the electrons according to the spin Hall effect, and the pure spin current S is likely to occur.

Normally, if a current is caused to flow into a metal, all the electrons move in a reverse direction to the current regardless of the spin direction. On the other hand, since the non-magnetic metal with a large atomic number having d electrons or f electrons in the inner shell has a large spin orbit interaction, a moving direction of electrons depends on a spin direction of the electrons according to the spin Hall effect, and the pure spin current $J_S$ is likely to occur.

In addition, the non-magnetic metal layer 1B may also include a magnetic metal. "Magnetic metal" refers to a ferromagnetic metal or an anti-ferromagnetic metal. This is because the spin orbit interaction is enhanced and a spin current generation efficiency with respect to a current flowing into the non-magnetic metal layer 1B can be increased if a small amount of a magnetic metal is included in the non-magnetic metal.

Since the spin orbit interaction is caused by an inherent inner field of the material of the non-magnetic metal layer 1B, a pure spin current also occurs in a non-magnetic material. If a small amount of a magnetic metal is added to the material of the non-magnetic metal layer 1B, an electron spin through which the magnetic metal itself flows is scattered, and thus spin current generation efficiency is improved. However, if the amount of the magnetic metal added is excessively increased, a generated pure spin is scattered by the added magnetic metal, and as a result, an effect of decreasing the spin current becomes stronger. Therefore, it is preferable that the mole ratio of the added magnetic metal be sufficiently smaller than a mole ratio of a main component of a pure spin generation unit in the non-magnetic metal layer 1B. As a standard, it is preferable that the mole ratio of the added magnetic metal be 3% or less.

Moreover, the non-magnetic metal layer 1B may also include a topological insulator. The non-magnetic metal layer 1B may be made of only a topological insulator. The topological insulator is a substance whose interior is an insulator or high resistance body, but in which a spin-polarized metal state occurs on the surface. The substance has something like an internal magnetic field called a spin orbit interaction. Therefore, even if there is no external magnetic field, a new topological phase is expressed by an effect of the spin orbit interaction. This is a topological insulator, and it can generate a pure spin current with high efficiency due to a strong spin orbit interaction and breakage of the reversal symmetry at the edge.

As the topological insulator, for example, SnTe, $Bi_{1.5}Sb_{0.5}Te_{1.7}Se_{1.3}$, $TlBiSe_2$, $Bi_2Te_3$, $(Bi_{1-x}Sbx)_2Te_3$, and the like are preferable. These topological insulators can generate spin currents with high efficiency.

The first electrode layer 5 and the second electrode layer 6 can include a ferromagnetic material. For example, in configuration A, configuration B, and configuration C described above, the materials of the first electrode layer 5 and the second electrode layer 6 are set to be ferromagnetic bodies having magnetization in reverse directions, and thereby it is possible to form two types of domains even in the case of one single domain in an initial state.

On the other hand, the first electrode layer 5 and the second electrode layer 6 can be general electrode materials. For example, in configuration C described above, a current flowing into the non-magnetic metal layer of the anti-ferromagnetic driving layer 1 through the first electrode layer 5 or the second electrode layer 6 generates a pure spin current at the time of writing, this pure spin current diffuses into the anti-ferromagnetic layer 1A, and a magnetic domain wall DW is moved to enable writing (refer to Non-Patent Document 2).

A method of reversing magnetization of the magnetic coupling layer and changing the proportion of the two types of domains in the exchange bias utilization type magnetization rotational element of the present invention will be described in detail in the description of the exchange bias utilization type magnetoresistance effect element (refer to FIGS. 7 and 9).

The proportion of the two types of domains can be changed in a digital manner or changed in an analog manner by reversing the magnetization of the magnetic coupling layer. Accordingly, the exchange bias utilization type magnetization rotational element of the present invention can be used as an element operating in a digital manner and as an element operating in an analog manner.

In the following description, as an application example of the exchange bias utilization type magnetization rotational element of the present invention, a case in which it is mainly applied to a magnetoresistance effect element will be described as an example. Applications thereof are not limited to the magnetoresistance effect element, and there can be other applications. The exchange bias utilization type magnetization rotational element is disposed in each pixel and can also be used for a spatial light modulator which spatially modulates incident light by using a magneto-optical effect. In addition, a magnetic field applied to a magnetization easy axis of a magnet may be replaced with the exchange bias utilization type magnetization rotational element to avoid a hysteresis effect caused by a coercive force of the magnet in a magnetic sensor.

(Exchange Bias Utilization Type Magnetoresistive Effect Element)

Figure 4:
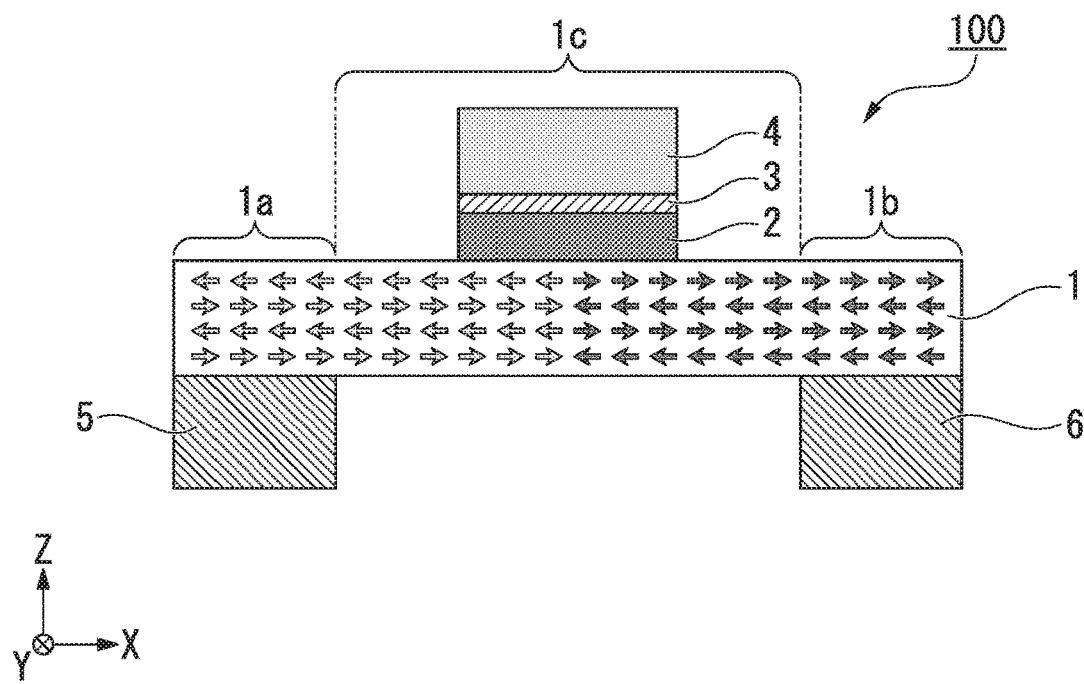
FIG. 4 is a schematic cross-sectional view of an example of an exchange bias utilization type magnetoresistance effect element according to an embodiment of the present invention.

FIG. 4 is a schematic cross-sectional view of an example of the exchange bias utilization type magnetoresistive effect element according to an embodiment of the present invention.

The exchange bias utilization type magnetoresistance effect element 100 shown in FIG. 4 includes the anti-ferromagnetic driving layer 1 which is made of the first region 1a, the second region 1b, and the third region 1c positioned between the first and second regions, the magnetic coupling layer 2 which is magnetically coupled to the anti-ferromagnetic driving layer 1 in the third region 1c, a non-magnetic layer 3 bonded to the magnetic coupling layer 2, a magnetization fixed layer 4 bonded to the non-magnetic layer 3, the first electrode layer 5 bonded to the first region 1a, and the second electrode layer 6 bonded to the second region 1b.

The exchange bias utilization type magnetoresistive effect element 100 can include the exchange bias utilization type magnetization rotational element of the present invention, the non-magnetic layer 3 bonded to the magnetic coupling layer 2, and the magnetization fixed layer 4 bonded to the non-magnetic layer 3.

In FIG. 4, a lamination direction of each layer, that is, a direction orthogonal to a main surface of each layer (a direction perpendicular to the surface), is defined as a Z direction. Each layer is formed in parallel to an XY surface orthogonal to the Z direction.

The magnetization fixed layer is a layer in which the magnetization direction does not change (magnetization is fixed) before and after writing using a write current, and any layer satisfying this condition can be used without particular limitation.

It is preferable that the length of the major axis of the anti-ferromagnetic driving layer 1 be 60 nm or more, and the distance between a position of the first electrode layer 5 which is closest to the magnetic coupling layer 2 and a position of the second electrode layer 6 which is closest to the magnetic coupling layer 2 be 60 nm or more.

The wall thickness of a domain is about tens of nm, and this is because two or more domains can be included in the anti-ferromagnetic driving layer.

A principle of writing and reading data in the exchange bias utilization type magnetoresistance effect element of the present invention will be described.

In each element of a conventional magnetic domain wall drive type MRAM, a magnetic domain wall driving layer made of a ferromagnetic material is responsible for holding recording data, and recording data may be rewritten due to an external magnetic field. On the other hand, although an anti-ferromagnetic driving layer made of an anti-ferromagnetic material is responsible for holding recording data in the exchange bias utilization type magnetoresistance effect element of the present invention, since the anti-ferromagnetic material has the same number of spins which cancel each other and thus has no magnetization as a whole, it has an advantage of being strong against external disturbance as compared to a ferromagnetic material, that is, recorded data is not easily rewritten in an external magnetic field.

First, the conventional magnetic domain wall drive type MRAM will be described.

The MRAM includes a magnetoresistance effect element which uses a magnetoresistance effect such as a giant magneto resistance (GMR) effect and a tunnel magneto resistance (TMR) effect as a memory cell. The magnetoresistance effect element has, for example, a laminated structure in which two ferromagnetic layers are laminated via a non-magnetic layer. The two ferromagnetic layers are a magnetization fixed layer (a pin layer) in which a magnetization direction is fixed, and a magnetization free layer (a free layer) in which a magnetization direction can be reversed. The electrical resistance of the magnetoresistance effect element is larger when the magnetization directions of the magnetization fixed layer and the magnetization free layer are anti-parallel to each other than when the magnetization directions thereof are parallel to each other. In the magnetoresistance effect element which is a memory cell of the MRAM, a state in which the magnetization directions are parallel to each other is associated with data "0" and an anti-parallel state is associated with data "1" using the difference in resistance value, and thereby data is stored in a non-volatile manner. Reading of data is performed by causing a read current to flow through the magnetoresistance effect element (to flow through the laminated structure) and measuring the resistance value of the magnetoresistance effect element. On the other hand, writing of data is performed by causing a spin-polarized current to flow and reversing the magnetization direction of the magnetization free layer.

As a current mainstream writing method of data, an "STT method" using a spin transfer torque is known. In the STT method, a spin-polarized current is injected into the magnetization free layer, a torque occurs in the magnetization free layer by an interaction between a spin of conduction electrons responsible for this current and a magnetic moment of the magnetization free layer, and when the torque is sufficiently large, the magnetization is reversed. Since this magnetization reversal occurs more when the current density increases, it is possible to reduce a write current as a memory cell size is reduced.

As the STT method, a method of causing a write current to flow through the magnetoresistance effect element (for example, Patent Document 1) and a method of causing a write current to flow in an in-plane direction of the magnetization free layer without flowing through the magnetoresistance effect element (for example, Patent Document 4) are known.

In the former method, spin-polarized electrons having the same spin state as the magnetization fixed layer are supplied from the magnetization fixed layer to the magnetization free layer or are extracted from the magnetization free layer to the magnetization fixed layer. As a result, the magnetization of the magnetization free layer is reversed by the spin transfer effect. In this manner, it is possible to define the magnetization direction of the magnetization free layer according to a direction of the write current flowing through the magnetoresistance effect element.

Figure 5:
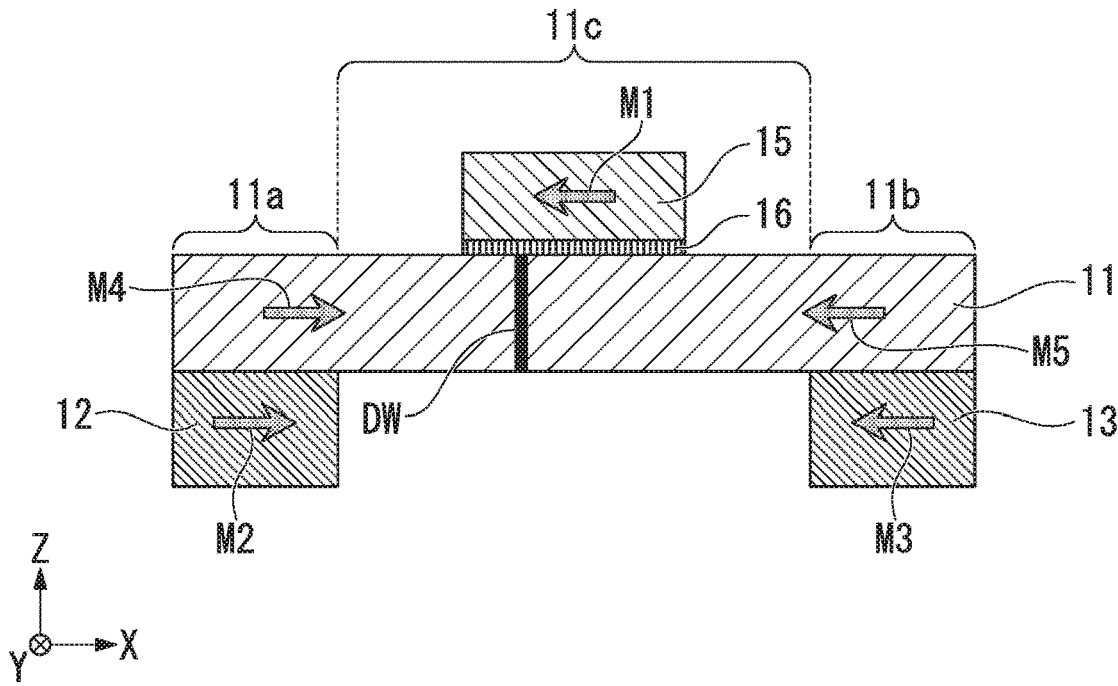
FIG. 5 is a schematic cross-sectional view which shows an example of a conventional magnetic domain wall drive type magnetoresistance effect element.

The latter method will be described with reference to FIG. 5. FIG. 5 is a schematic cross-sectional view which shows an example of a conventional magnetic domain wall drive type magnetoresistance effect element.

The conventional magnetic domain wall drive type magnetoresistance effect element shown in FIG. 5 includes a magnetic domain wall driving layer (a magnetization free layer) 11 which has a magnetic domain wall DW and is made of a first region 11a, a second region 11b, and a third region 11c positioned between the first and second regions, a magnetization fixed layer 15 provided via a non-magnetic layer 16 in the third region, a first magnetic domain wall supply layer 12 which is in contact with the first region 11a and has a first magnetization direction, and a second magnetic domain wall supply layer 13 which is in contact with the second region 11b and has a second magnetization direction that is reverse to the first magnetization direction.

In FIG. 5, an arrow M1, an arrow M2, and an arrow M3 indicate the magnetization direction of each layer, and an arrow M4 and an arrow M5 indicate a magnetization direction of a portion of the magnetic domain wall driving layer 11 on a first magnetic domain wall supply layer 12 side with the magnetic domain wall DW as a boundary, and a magnetization direction of a portion of the magnetic domain wall driving layer 11 on a second magnetic domain wall supply layer 13 side with the magnetic domain wall DW as a boundary.

In the conventional magnetic domain wall drive type magnetoresistance effect element shown in FIG. 5, the writing of data is performed by moving the magnetic domain wall DW formed in the magnetization free layer 11. The magnetic domain wall driving layer 11 includes the first region 11a and the second region 11b whose magnetizations are fixed to be substantially anti-parallel to each other, and the third region 11c positioned between the first region 11a and the second region 11b, and the magnetization of the third region 11c is substantially parallel to any one of those of the first region 11a and the second region 11b. Due to such restriction of the magnetization state, a magnetic domain wall is introduced in the magnetic domain wall driving layer 11. The position of the magnetic domain wall can be moved by a current flowing into the magnetic domain wall driving layer 11.

Figure 6A:
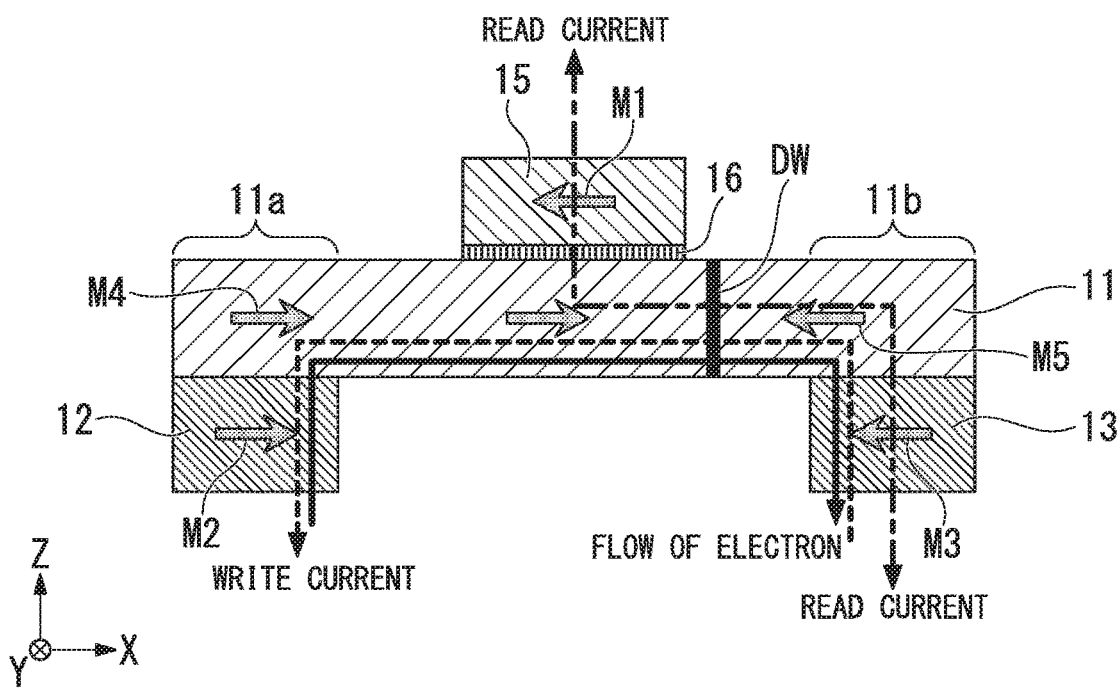
FIG. 6A is a schematic cross-sectional view showing a magnetic domain wall moving method in the conventional magnetic domain wall drive type magnetoresistance effect element.
Figure 6B:
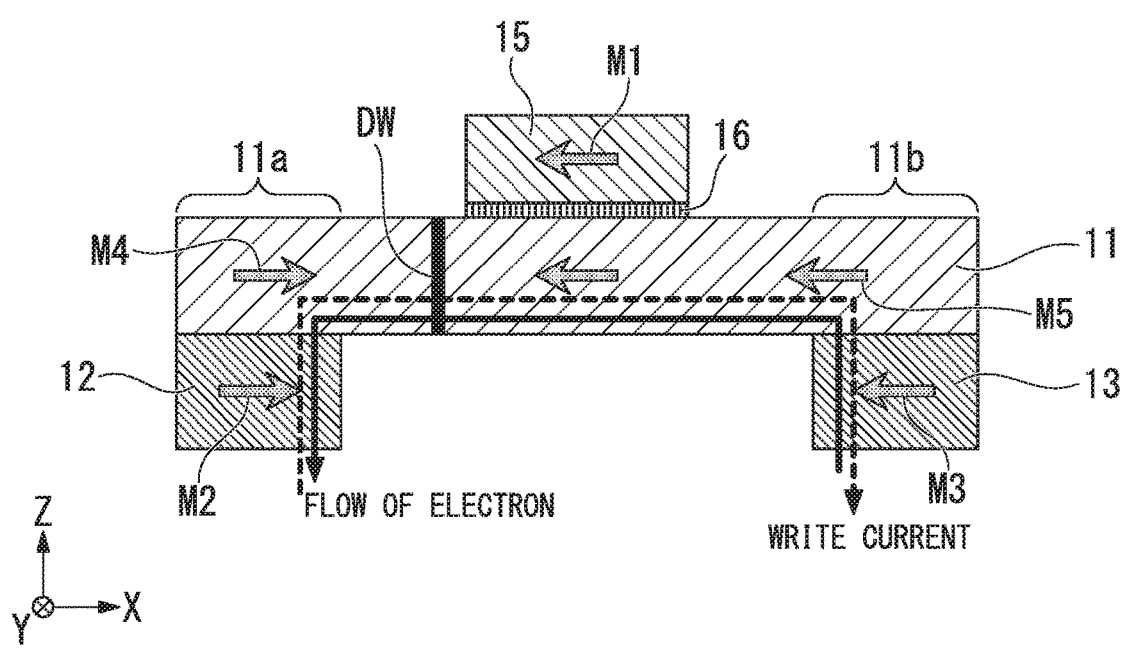
FIG. 6B is a schematic cross-sectional view showing the magnetic domain wall moving method which causes a magnetic domain wall to move in an opposite direction to that in FIG. 6A.

For example, if a current flows from the second magnetic domain wall supply layer 13 to the magnetic domain wall driving layer 11 and further to the first magnetic domain wall supply layer 12 in a direction indicated by a dotted line of FIG. 6A, conduction electrons flow in a direction indicated by a solid line which is opposite to a direction of the current. If electrons enter the magnetic domain wall driving layer 11 from the first magnetic domain wall supply layer 12, the electrons become spin-polarized electrons corresponding to a magnetization direction of a domain magnetically coupled with the first magnetic domain wall supply layer 12 and the first magnetic domain wall supply layer 12 of the magnetic domain wall driving layer 11. If the spin-polarized electrons reach a magnetic domain wall, a spin of the spin-polarized electrons in the magnetic domain wall causes a spin transfer to the magnetic domain wall, and the magnetic domain wall moves in the same direction as a direction in which conduction electrons flow. In the same manner, if a current flows from the first magnetic domain wall supply layer 12 to the magnetic domain wall driving layer 11 and further to the second magnetic domain wall supply layer 13 in a direction indicated by a dotted line of FIG. 6B, conduction electron flow in a direction indicated by a solid line which is opposite to a direction of the current. If electrons enter the magnetic domain wall driving layer 11 from the second magnetic domain wall supply layer 13, electrons become spin-polarized currents corresponding to a magnetization direction of a domain magnetically coupled with the second magnetic domain wall supply layer 13 and the second magnetic domain wall supply layer 13 of the magnetic domain wall driving layer 11. If the spin-polarized electrons reach the magnetic domain wall, a spin of the spin-polarized electrons in the magnetic domain wall causes a spin transfer to the magnetic domain wall and the magnetic domain wall moves in the same direction as a direction in which conduction electrons flow.

With the movement of the magnetic domain wall, a magnetization of a portion of the magnetic domain wall driving layer 11 immediately under the magnetization fixed layer 15 can be made to be parallel or can be made to be anti-parallel to the magnetization direction of the magnetization fixed layer 15. In this manner, information can be rewritten between a "0" state and a "1" state.

The reading of data is performed by causing a current to flow between the magnetization fixed layer 15 and the magnetic domain wall driving layer 11 via the non-magnetic layer 16 and detecting a change in resistance in accordance with a relative angle between the magnetization of the magnetization fixed layer 15 and the magnetization of the magnetic domain wall driving layer 11. When the magnetization of the portion of the magnetic domain wall driving layer 11 immediately under the magnetization fixed layer 15 is in a parallel state to the magnetization direction of the magnetization fixed layer 15, resistance is low, and on the other hand, the resistance is high in the case of being in an anti-parallel state, and thus data can be discriminated by detecting the change in resistance.

On the other hand, the exchange bias utilization type magnetoresistance effect element of the present invention is an element which realizes a signal output in the analog manner using a relative angle of a magnetization direction with respect to the magnetic coupling layer 2 with the magnetization fixed layer 4 which is a reference layer set as a reference. The magnetization direction of the magnetic coupling layer 2 is determined by a proportion of domains of the anti-ferromagnetic driving layer 1 bonded thereto.

In an anti-ferromagnetic body, a spin responsible for magnetic properties is coupled to be anti-parallel thereto in micro, and, as for a whole substance, spontaneous magnetization is zero and has no magnetic properties. However, if it is bonded to a ferromagnetic body, it is known that a strong magnetic coupling at a bonding interface is shown. The magnetic field generated at this bonding interface is called an exchange bias magnetic field or a exchange couple magnetic field.

Like the ferromagnetic body, a magnetic domain (a domain) and a magnetic domain wall are also present in the anti-ferromagnetic body. In the case of the anti-ferromagnetic body, since spins cancel each other and do not have spontaneous magnetization, it is not possible to distinguish a direction of a magnetic domain like the ferromagnetic body from a direction of spontaneous magnetization. However, each spin can take two directions like the ferromagnetic body. This is called sublattice magnetization. In the anti-ferromagnetic body, it will be zero if all sublattice magnetization is added. Therefore, the anti-ferromagnetic body can take two states with different sublattice magnetization directions, and this appears as a magnetic domain (a domain) structure.

It is known that an exchange bias magnetic field (an exchange couple magnetic field) generated at the interface bonded to the ferromagnetic body is determined depending on a direction of an interface spin on an anti-ferromagnetic body side. It can also be said that the exchange bias magnetic field changes according to the proportion of two types of magnetic domains on the anti-ferromagnetic body side. Normally, since two domain states of the anti-ferromagnetic body are maintained at equivalent energy states even when a magnetic field is applied from the outside, it is difficult to change the proportion. However, if a material whose time reversal symmetry and space reversal symmetry on the magnetic symmetry are simultaneously broken like the materials disclosed in the present invention (configuration A, configuration B), it is possible to change the proportion of two types of domains (one of the two types of domains is referred to as "a first domain", and the other is referred to as "a second domain") by causing a current to flow into the anti-ferromagnetic body. By using these materials for the anti-ferromagnetic driving layer, a difference in stability of energy of the two domains of the anti-ferromagnetic body between when a current flows from one side of a major axis of the anti-ferromagnetic behavior layer and when a current flow in the opposite direction occurs, and as a result, the proportion of the two types of domains changes such that the energy becomes stable. In addition, the proportion of the two domains can be changed using a laminated configuration (configuration C) including an anti-ferromagnetic layer, and a non-magnetic metal layer that is bonded to the anti-ferromagnetic layer and in which a pure spin current is generated by a current flowing from a side bonded to the magnetic coupling layer.

Figure 7:
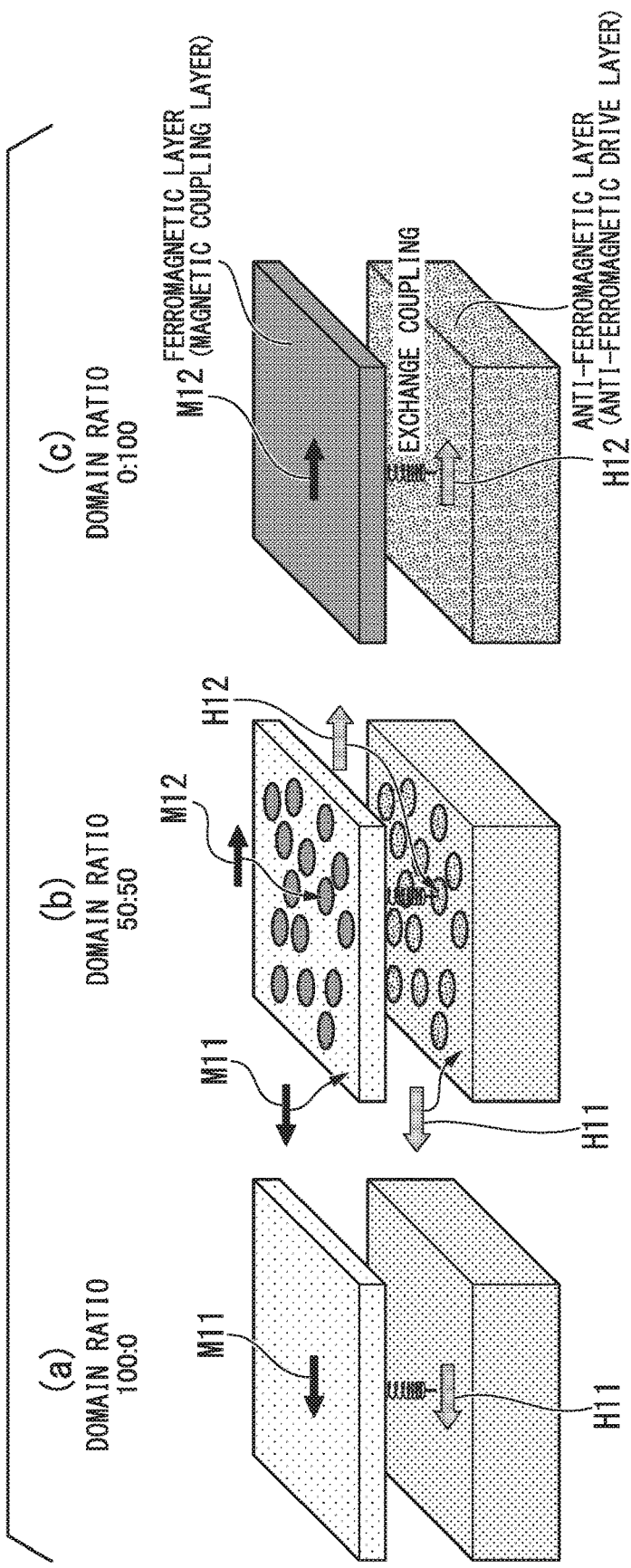
FIG. 7 is a schematic diagram showing a change in proportion (ratio) of a domain of an anti-ferromagnetic driving layer and magnetization direction of a magnetic coupling layer: (a) is a case in which the domain ratio is 100:0, (b) is a case in which the domain ratio is 50:50, and (c) is a case in which the domain ratio is 0:100.

FIG. 7 shows a state of a magnetic domain of the magnetic coupling layer in each state of (a) when the proportion of domains that generates an exchange bias magnetic field indicated by a reference numeral H11 is 100%, (b) when the proportion of domains in a direction of the exchange bias magnetic field indicated by the reference numeral H11 and a domain in a direction of an exchange bias magnetic field indicated by a reference numeral H12 is 50%, and (c) when the proportion of domains in the direction indicated by the reference numeral H12 is 100% in a complex including the anti-ferromagnetic layer (the anti-ferromagnetic driving layer) and the ferromagnetic layer (the magnetic coupling layer).

The anti-ferromagnetic layer (the anti-ferromagnetic driving layer) generates an exchange bias magnetic field or an exchange couple magnetic field as indicated by arrows H11 and H12 of (a) or (c) depending on a direction of the domain. As a result, it is possible to fix a magnetization direction of an adjacent ferromagnetic body to a direction of M11 and M12 without having an external magnetic field. In the case of (b), the magnetic domain of the ferromagnetic layer (the magnetic coupling layer) is also in a state in which M11 and M12 are equally present by reflecting the proportion of domains of the anti-ferromagnetic layer.

Change modes of the domain portion are largely classified into two types of: one type in which a reversed domain randomly occurs, and each domain (domain nucleus) grows to reach complete reversal (hereinafter, may be referred to as "a nucleation type"), and the other type in which the proportion of domains changes by moving a domain wall (magnetic domain wall) for dividing two domains having magnetization directions opposite to each other (hereinafter, may be referred to as "a domain wall moving type"). As the nucleation type, for example, it is possible to exemplify a case in which the first electrode layer and the second electrode layer do not have the magnetic domain wall DW in advance in the anti-ferromagnetic driving layer like an element made of a nonmagnetic metal such as Cu or Al. In addition, as the domain wall moving type, for example, an exemplary case is one in which domain directions at both ends of the anti-ferromagnetic layer driving layer are fixed and the magnetic domain wall DW exists between two domains all the time.

Figure 8:
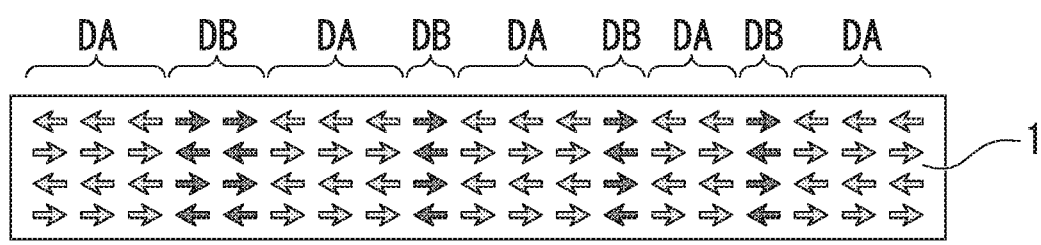
FIG. 8 is a schematic cross-sectional view showing two types of domains of the anti-ferromagnetic driving layer.
Figure 9:
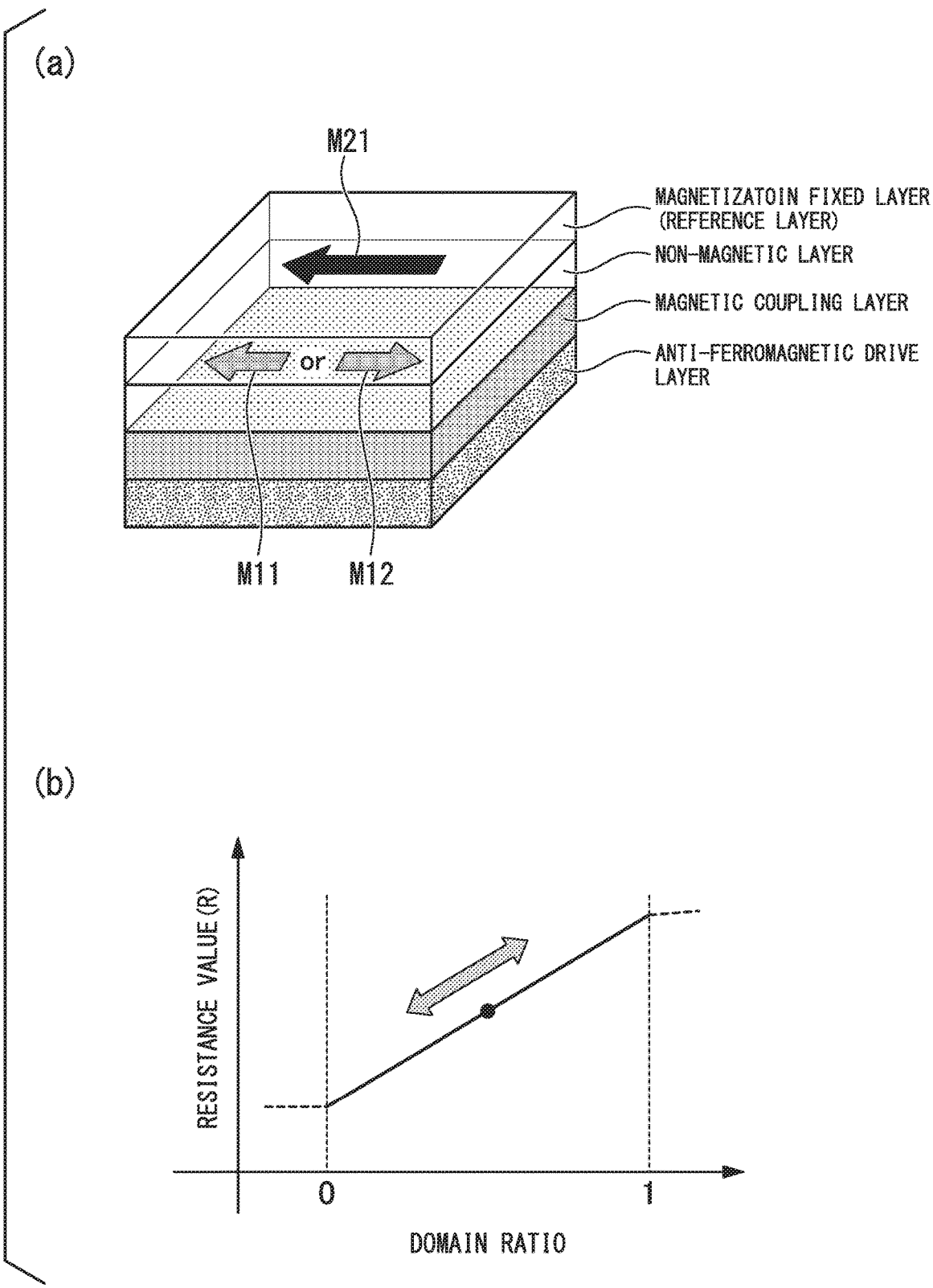
FIG. 9(a) is a perspective view which schematically shows a laminated portion of the anti-ferromagnetic driving layer, a magnetic coupling layer, a non-magnetic layer, and a magnetization fixed layer.
FIG. 9(b) is a graph which shows a relationship between a proportion of the two types of domains and a resistance value of a current vertically flowing through an element.

FIGS. 7 and 8 are diagrams which show nucleation types, FIGS. 1, 2, 4, and 10 to 14 are diagrams which show domain wall moving types, and FIG. 9 is a diagram corresponding to any one of two types of change modes.

The proportion of the two types of domains can be changed by causing a current into the anti-ferromagnetic driving layer which is configured to include an anti-ferromagnetic material having a zinc-blende structure or configured to include an anti-ferromagnetic material of any one of CuMnAs and Mn2Au. A case in which the proportion of domains in the direction of the exchange bias magnetic field indicated by the reference numeral H11 is increased, and a case in which the proportion of domains in the direction indicated by the reference numeral H12 is increased can be selected by reversing a direction of flowing current. Since the anti-ferromagnetic material having a zinc-blende structure has broken space reversal symmetry (as a result, since time and space reversal symmetry are broken if a spin is included), it is possible to change the proportion of the two types of domains by causing a current to flow. In addition, CuMnAs and Mn2Au do not have broken space reversal symmetry, but, if spin is included, time and space reversal symmetry thereof are broken, and thus it is possible to change the proportion of the two types of domains by causing a current to flow.

FIG. 8 is a schematic cross-sectional view showing two types of domains of the anti-ferromagnetic driving layer.

In FIG. 8, DA and DB indicate two types of domains with different sublattice magnetization directions. Spins directions opposite to each other are disposed on surfaces bonded to the magnetic coupling layers of DA and DB, respectively. As described above, the anti-ferromagnetic driving layer has a configuration in which two types of domains form domains having the same spin, respectively, in a surface bonded to the magnetic coupling layer. For this reason, the proportion of the two types of domains is changed on a surface bonded to the magnetic coupling layer, and thereby influence on the magnetization direction of the magnetic coupling layer changes as shown in FIG. 9. That is, as the proportion of the two types of domains changes, the proportion of magnetic domains of the magnetic coupling layer changes, and the magnitude of the magnetoresistance R changes in accordance this proportion.

FIG. 9A is a perspective view which schematically shows a laminated portion of the anti-ferromagnetic driving layer, the magnetic coupling layer, the non-magnetic layer, and the magnetization fixed layer, M21 is a magnetization direction of the magnetization fixed layer, and M11 and M12 are a magnetization direction of the magnetic coupling layer. FIG. 9B is a graph which shows an outline of a relationship between the proportion of the two types of domains (represented by a ratio of 0 to 1) and the resistance value (R) of current vertically flowing through an element.

In the exchange bias utilization type magnetoresistance effect element of the present invention, the writing of data is performed by changing the proportion of these two types of domains and, as a result, changing the proportion of magnetic domains of the magnetic coupling layer. Specifically, the writing of data, with reference to FIG. 4, is performed by causing a current to flow into the anti-ferromagnetic driving layer from the first electrode layer 5 (the second electrode layer 6) to the second electrode layer 6 (the first electrode layer 5) via the anti-ferromagnetic driving layer 1. If the current between the first electrode layer 5 and the second electrode layer 6 is stopped, since the domains of the anti-ferromagnetic driving layer 1 do not change, the proportion of magnetic domains of the magnetic coupling layer 2 is also fixed there. Furthermore, if a current flows in the same direction, an increase or decrease in the proportion of magnetic domains further changes in the same direction, and, if a current flows in the opposite direction, the proportion returns to an original state. If the proportions of the magnetic domain of the magnetic coupling layer in an anti-parallel direction and the magnetic domain of the magnetic coupling layer in a parallel direction change, resistance of a current vertically flowing through an element changes, and thus data is recorded as a magnitude of magnetoresistance.

The writing of data in an exchange bias utilization type magnetoresistance effect element using configuration C will be further supplemented. FIGS. 2 and 4 are referred to. A current is caused to flow into an anti-ferromagnetic driving layer made of the anti-ferromagnetic layer 1A and the non-magnetic metal layer 1B from the first electrode layer 5 (the second electrode layer 6) to the second electrode layer 6 (the first electrode layer 5) via the anti-ferromagnetic driving layer 1. As a result, a pure spin current occurs in the non-magnetic metal layer 1B, this pure spin current diffuses into the anti-ferromagnetic layer 1A, the proportion of domains of the anti-ferromagnetic layer 1A changes, and as a result, the proportion of magnetic domains of the magnetic coupling layer 2 changes.

A domain in a surface bonded to the magnetic coupling layer has a size of about tens of nm, and thus a magnitude of the exchange bias magnetic field can be substantially changed in the analog manner.

The current density applied to the anti-ferromagnetic driving layer at the time of writing is set to $1 \times 10^7$ A/cm$^2$ or more.

A current density is set to $1 \times 10^7$ A/cm$^2$ or more, and thereby a domain is formed in the anti-ferromagnetic driving layer (refer to Non-Patent Document 1).

Figure 10A:
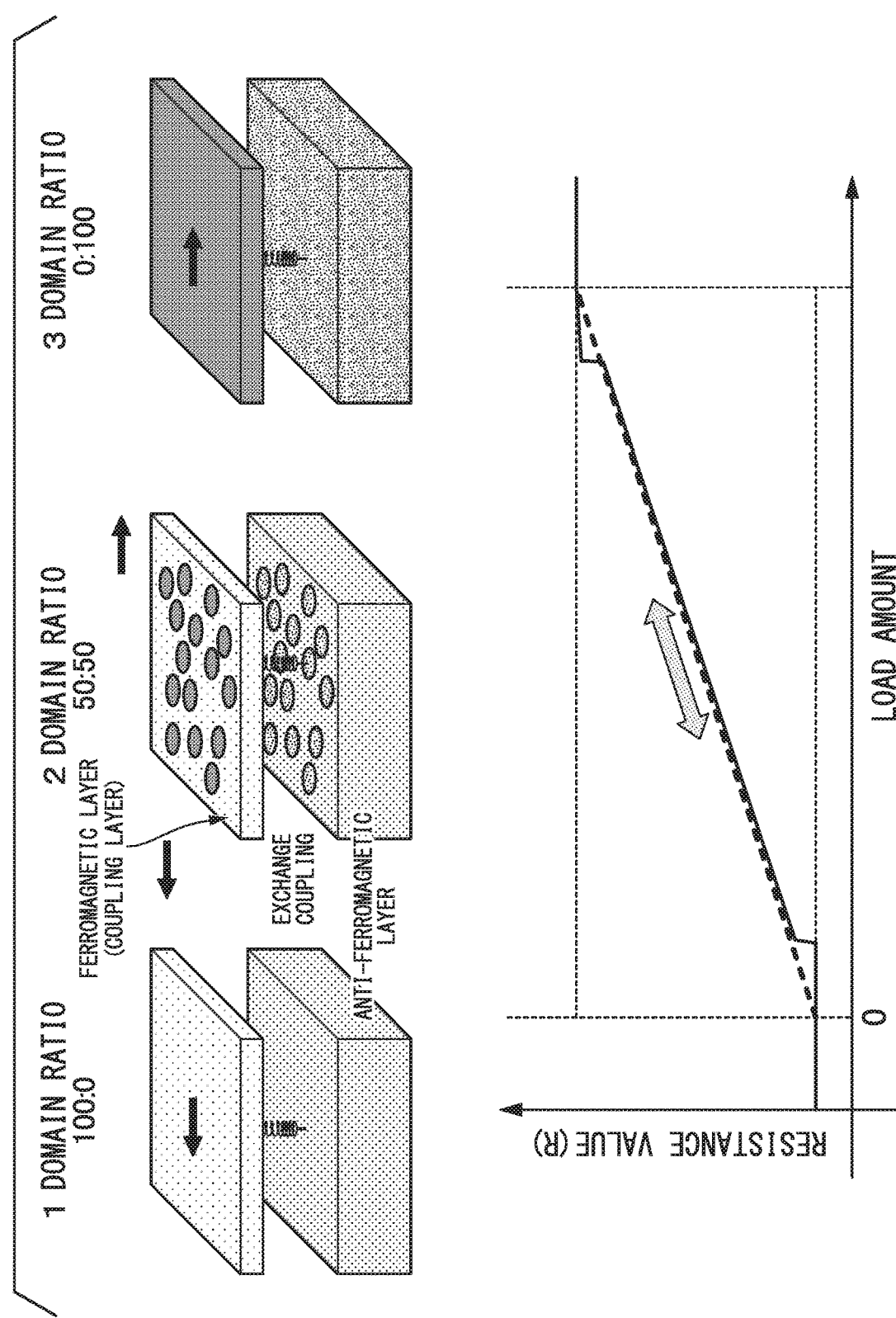
FIG. 10A is a graph which, when a constant load amount that changes a ratio of two types of domains such as a first domain and a second domain is given, shows a relationship between the load amount and a resistive value.
Figure 10B:
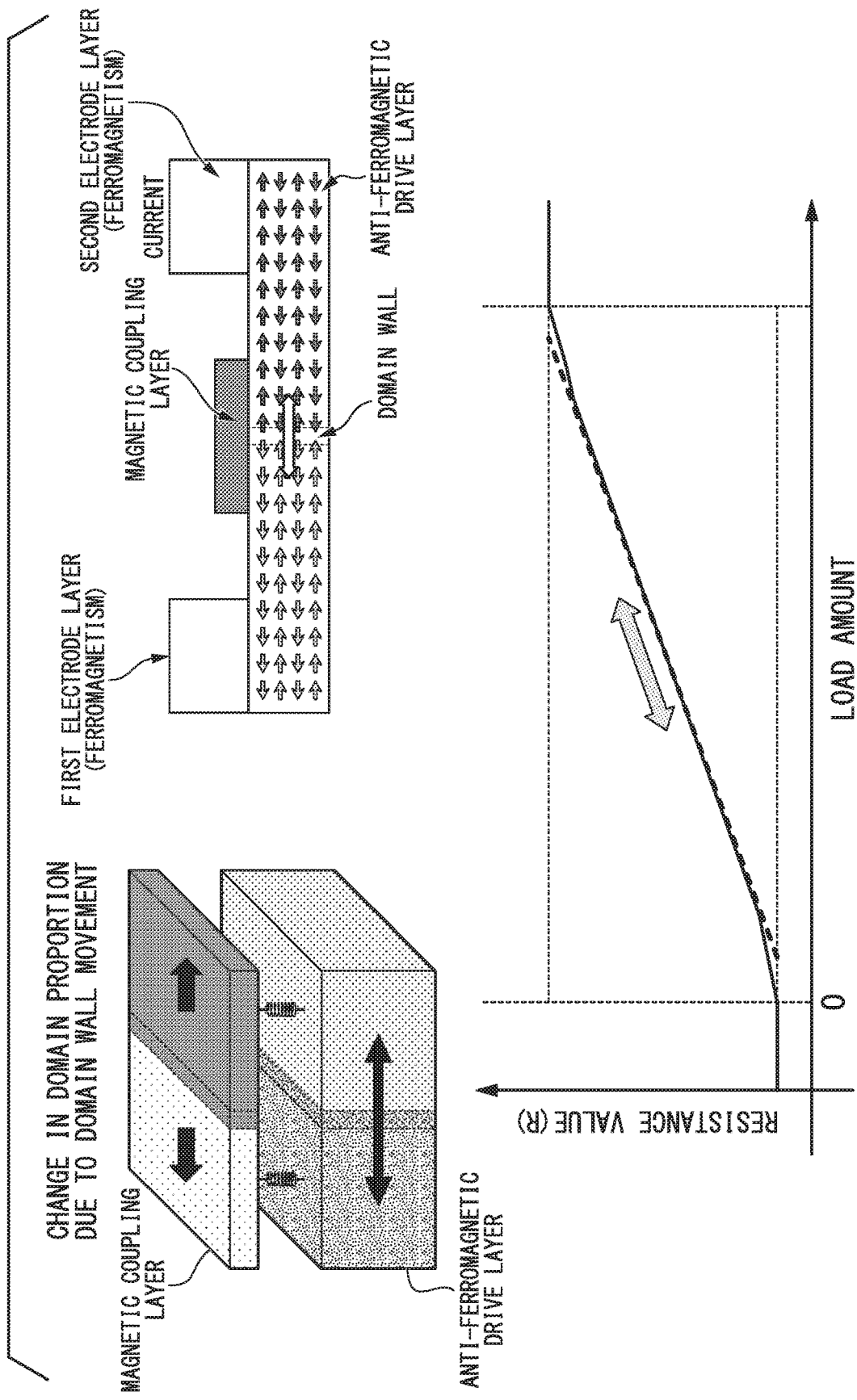
FIG. 10B is a graph which, when a constant load amount that changes the ratio of two types of domains, the first domain and the second domain, is given, shows a relationship between the load amount and a resistance value.

FIGS. 10A and 10B are graphs which schematically show characteristics of a case in which the anti-ferromagnetic driving layer is a nucleation type and a case in which the anti-ferromagnetic driving layer is a domain wall moving type with respect to, when a constant load amount (for example, a current) for changing a ratio of two types of domains of a first domain and a second domain is given, a relationship between the load amount and a resistance value, respectively. In FIGS. 10A and 10B, graphs indicated by dotted lines show ideal resistance changes in which the load amount is substantially proportional to the resistance value.

When the anti-ferromagnetic driving layer is a nucleation type, as shown in FIG. 10A, since a domain cannot exist below a critical domain size, if compared with an ideal resistance change, a resistance value change is discontinuous in the vicinity of both ends of 0 and 1.

On the other hand, when the anti-ferromagnetic driving layer is a domain wall moving type, as shown in FIG. 10B, if compared with an ideal resistance change, a resistance value change is continuous but becomes more gradual with an influence of a domain wall portion in the vicinity of both ends of 0 and 1 of the domain proportion.

A graph of a relationship between a load amount and a resistance value shown in FIGS. 10A and 10B reflects a relationship between the load amount and the domain ratio (a change rate of the domain ratio with respect to the load amount). Accordingly, in each of FIGS. 10A and 10B, characteristics of the relationship between the load amount and the domain ratio are shown by replacing a vertical axis with the domain ratio.

When the anti-ferromagnetic driving layer is a nucleation type, there is an advantage that manufacturing is easy due to a simple structure as compared to a case in which the anti-ferromagnetic driving layer is a domain wall moving type. On the other hand, when the anti-ferromagnetic driving layer is the domain wall moving type, there is an advantage that an effective analog operation with high continuity can be realized as compared with a case in which the anti-ferromagnetic driving layer is a nucleation type.

The exchange bias utilization type magnetoresistance effect element of the present invention can change the proportion of two types of domains in the digital manner by reversing the magnetization of the magnetic coupling layer or changing magnetoresistance in the digital or analog manner by changing the proportion in the analog manner. Therefore, the exchange bias utilization type magnetoresistance effect element of the present invention can be used as an element operating in the digital manner or as an element operating in the analog manner.

In the exchange bias utilization type magnetoresistance effect element of the present invention, the reading of data, if referring to FIG. 4, is performed by causing a current to flow between the first electrode layer 5 of the second electrode layer 6 and the magnetization fixed layer 4 which is a reference layer, and measuring a resistance value due to magnetoresistance in accordance with a relative angle of magnetization between the magnetic coupling layer 2 and the magnetization fixed layer 4. For this reason, a read current is made sufficiently lower than a current density at the time of writing such that recorded information is not changed. The same will be applied to the reading of data in the exchange bias utilization type magnetoresistance effect element using configuration C.

Figure 11:
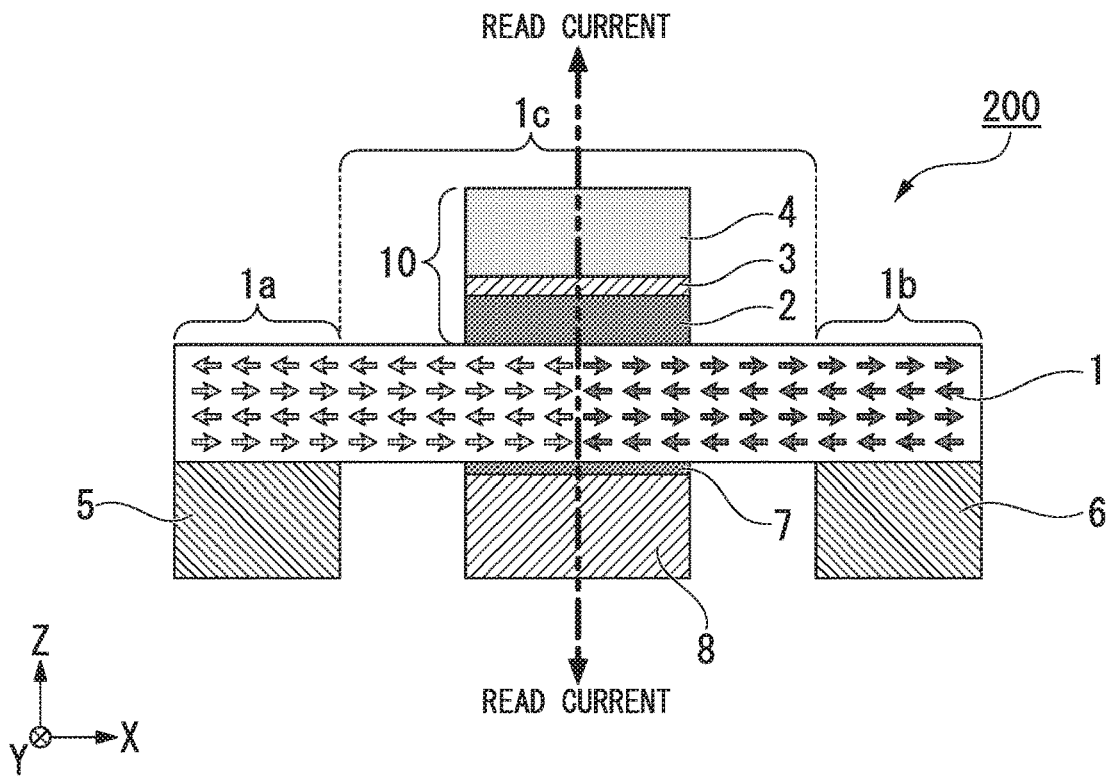
FIG. 11 is a schematic cross-sectional view of an example of the exchange bias utilization type magnetoresistance effect element according to another embodiment of the present invention.

FIG. 11 is configuration in which a lower electrode layer 8 provided at a position overlapping the magnetic coupling layer 2 in a plan view on a surface of the third region 1c which is opposite to a surface on which the magnetic coupling layer 2 is provided in the exchange bias utilization type magnetoresistance effect element shown in FIG. 4. With this configuration, a read current flows through the anti-ferromagnetic driving layer 1 in a plane perpendicular direction as indicated by a two-dot chain line in FIG. 7. For this reason, in a state in which influence on a domain of the anti-ferromagnetic driving layer 1 is reduced, it is possible to obtain an output by a magnetoresistance effect between the magnetic coupling layer 2 and the magnetization fixed layer 4. In addition, since a read current can be increased, a reading speed can be increased. Moreover, since a distance of the anti-ferromagnetic driving layer 1 through which the read current flows is short, magnetic noise can be reduced.

In the MRAM using a conventional magnetic domain wall drive type magnetoresistance effect element, a write current of data does not pass through the magnetoresistance effect element (a laminated structure made of the magnetization fixed layer 15 and the magnetic domain wall driving layer 11 via the non-magnetic layer 16 in FIG. 5), and flows in the in-plane direction (a direction parallel to a lamination direction) of the magnetization free layer (refer to FIG. 6). On the other hand, a read current of data passes through the magnetoresistance effect element (the laminated structure made of the magnetization fixed layer 15 and the magnetic domain wall driving layer 11 via the non-magnetic layer 16) in the lamination direction as indicated by a dashed line of FIG. 6A, and thereafter, flows through a part of a path through which the write current flows (for example, refer to Patent Document 5). That is, the path of the read current partially overlaps the path of the write current.

As described above, in a configuration of the conventional magnetic domain wall drive type MRAM, it is necessary to cause a current to flow in a magnetic domain wall drive direction (the in-plane direction) of the magnetic domain wall driving layer at the time of reading. For this reason, an obtained output signal finally becomes a digital signal of 0 o 1. In addition, in a plan view, if a movement of the magnetic domain wall is not completed on an outer side than a portion in which the magnetic domain wall driving layer (the magnetization free layer) overlaps the magnetoresistance effect element portion, there have been problems that the magnetic domain wall moves at the time of reading to cause erroneous writing or reading, initial signals are changed, and the like.

On the other hand, in the exchange bias utilization type magnetoresistance effect element of the present invention, such a problem does not occur by adopting the configuration in which the lower electrode layer 8 provided at a position overlapping the magnetic coupling layer 2 in a plan view is included.

A shape of the lower electrode layer 8 is preferably in the same size as the magnetization fixed layer 4 in a plan view so as not to have a horizontal component of the read current (the spin-polarized current), but it is still effective even though not in the same size. For example, in a plan view, the overlapping degree between the lower electrode layer 8 and the magnetization fixed layer 4 is preferably 50% or more, more preferably 90% or more, and further preferably 100%.

As the material of the lower electrode layer 8, a known material used as an electrode material can be used. For example, it is possible to use aluminum, silver, copper, gold, and the like.

The exchange bias utilization type magnetoresistance effect element 200 shown in FIG. 11 further includes a high resistance layer 7 between the anti-ferromagnetic driving layer 1 and the lower electrode layer 8. The high resistance layer 7 is a layer with higher electric resistivity than the anti-ferromagnetic driving layer 1. The high resistance layer 7 is a layer for preventing a writing operation (a change of the domain proportion) from being inhibited by a current flowing into the lower electrode layer 8 at the time of writing. There is no particular limitation on a material of the high resistance layer 7 as long as the material has such a function. The material may be a non-magnetic material. The high resistance layer 7 may be a tunnel barrier layer. As a result, the high resistance layer 7 may also be an insulating material capable of causing a tunneling current to flow.

When the high resistance layer 7 is an insulating material, a thickness of the high resistance layer 7 is preferably 0.8 nm or more such that a write current does not flow into the lower electrode layer 8. On the other hand, the thickness is preferably 2 nm or less from a viewpoint of making an influence on a read operation negligible.

The material of the high resistance layer 7 is not particularly limited as long as the layer is a layer capable of suppressing (substantially preventing) the write current from flowing into the lower electrode layer 8. The high resistance layer 7 may be a tunnel barrier layer, and can be a known insulating material which can be used for a tunnel barrier layer. For example, $Al_2O_3$, $SiO_2$, MgO, $MgAl_2O_4$, and the like can be used. In addition to these materials, materials in which a part of Al, Si, and Mg is replaced with Zn, Be, and the like can also be used. The material of the high resistance layer 7 functions if at least the resistivity is higher than the anti-ferromagnetic driving layer 1. For example, a semiconductor such as Si, SiGe, or Ge may also be used.

The magnetization fixed layer 4 is a layer (a ferromagnetic layer) made of a ferromagnetic material with fixed magnetization.

As a material of the magnetization fixed layer 4, a known material which can be used for the magnetization fixed layer can be used. For example, it is possible to use a type of metal selected from a group consisting of Cr, Mn, Co, Fe, and Ni, and an alloy with ferromagnetic properties containing at least one of these metals. In addition, it is also possible to use an alloy containing these metals and at least one element of B, C, and N. Specifically, Co—Fe or Co—Fe—B are exemplary examples.

In addition, it is preferable to use a Heusler alloy such as $Co_2FeSi$ to obtain a higher output. The Heusler alloy contains an intermetallic compound having a chemical composition of $X_2YZ$, X is a transition metal element or a noble metal element of a Co, Fe, Ni, or Cu group in a periodic table, Y is a transition metal of a Mn, V, Cr, or Ti group and can have an element type of X, and Z is a typical element of a group III to a group V. For example, $Co_2FeSi$, $Co_2MnSi$, $Co_2Mn_{1-a}Fe_aAl_bSi_{1-b}$, or the like are exemplary examples.

Furthermore, the magnetization fixed layer 4 may have a synthetic structure composed of an anti-ferromagnetic layer, a ferromagnetic layer, and a non-magnetic layer. Since a magnetization direction is strongly held by the anti-ferromagnetic layer in the synthetic structure, the magnetization fixed layer 4 can function as a magnetization fixed layer which is hardly affected from the outside.

Furthermore, when a magnetization direction of the magnetization fixed layer 4 is set to be perpendicular to a laminated surface, it is preferable to use a laminated film of Co and Pt. Specifically, the magnetization fixed layer 4 can be [Co(0.24 nm)/Pt(0.16 nm)]$_6$/Ru(0.9 nm)/[Pt(0.16 nm)/Co(0.16 nm)]$_4$/Ta(0.2 nm)/FeB (1.0 nm).

The magnetization of the magnetization fixed layer 4 is fixed in one direction, and a proportion of magnetic domains in a parallel direction and an anti-parallel direction of the magnetic coupling layer 2 relatively changes to function as the magnetoresistance effect element unit 10. The magnetoresistance effect element unit 10 is like the tunnel magneto resistance (TMR) element when the non-magnetic layer 3 is made of an insulator, and is like a giant magneto resistance (GMR) element when the non-magnetic layer 3 is made of a metal.

As a material of the non-magnetic layer 3, it is possible to use a known material which can be used for a non-magnetic layer.

For example, when the non-magnetic layer 3 is made of an insulator (in the case of a tunnel barrier layer), $Al_2O_3$, $SiO_2$, MgO, $MgAl_2O_4$, $ZnAl_2O_4$, $MgGa_2O_4$, $ZnGa_2O_4$, $MgIn_2O_4$, $ZnIn_2O_4$, and a multilayered film, a mixed composition film, or the like of these materials can be used as the material of the non-magnetic layer 3. In addition to these materials, a material in which a part of Al, Si, and Mg is replaced with Zn, Be, and the like can be also used. Since MgO or $MgAl_2O_4$ of these materials is a material which can realize coherent tunneling, it is possible to efficiently inject a spin thereinto.

In addition, when the non-magnetic layer 3 is made of metal, Cu, Au, Ag, and the like can be used as the material thereof.

As the material of the magnetic coupling layer, a known material which can be used for the magnetization free layer of the magnetoresistance effect element can be generally used. For example, it is possible to use a type of metal selected from the group consisting of Cr, Mn, Co, Fe, and Ni, and an alloy with ferromagnetic properties containing at least one of these metals. In addition, it is also possible to use the alloy containing these metals and at least one element of B, C, and N. Specifically, Co—Fe or Co—Fe—B are exemplary examples.

In addition, it is preferable to use a Heusler alloy such as $Co_2FeSi$ to obtain a higher output. The Heusler alloy contains an intermetallic compound having a chemical composition of $X_2YZ$, X is a transition metal element or a noble metal element of a Co, Fe, Ni, or Cu group in a periodic table, Y is a transition metal of a Mn, V, Cr, or Ti group and can have an element type of X, and Z is a typical element of a group III to a group V. For example, $Co_2FeSi$, $Co_2MnSi$, $Co_2Mn_{1-a}Fe_aAl_bSi_{1-b}$, or the like are exemplary examples.

The magnetic coupling layer 2 includes a laminated structure including a magnetoresistance effect layer and a soft magnetic layer in order from the side of a non-magnetic layer 3 side, and the magnetoresistance effect layer is made of a material containing CoFeB.

With such a configuration, it is possible to prevent a domain transcription of the anti-ferromagnetic driving layer by the exchange bias magnetic field from being inhibited by hysteresis, and as a result a deviation of resistance value can be suppressed to be small.

The magnetization easy axis of the anti-ferromagnetic driving layer 1, the magnetic coupling layer 2, and the magnetization fixed layer 4 may be parallel or perpendicular to the lamination direction. In the case of being perpendicular, it is possible to effectively change a relative relationship between the magnetic coupling layer and the magnetization fixed layer 4 by applying a current through the anti-ferromagnetic driving layer at the time of writing.

Figure 12:
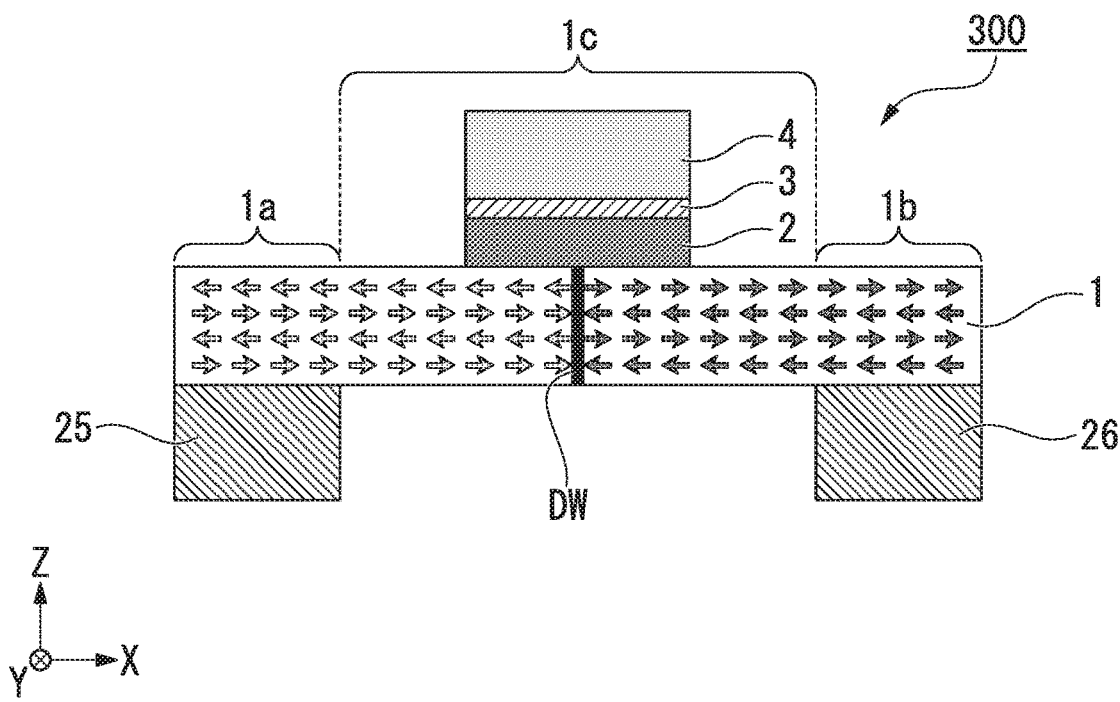
FIG. 12 is a schematic cross-sectional view of an example of the exchange bias utilization type magnetoresistance effect element according to another embodiment of the present invention.

An exchange bias utilization type magnetoresistance effect element 300 shown in FIG. 12 is different in that the first electrode layer and the second electrode layer of the exchange bias utilization type magnetoresistance effect element 100 shown in FIG. 4 are configured to be made of ferromagnetic materials having magnetization directions opposite to each other. Reference numerals 25 and 26 denote the first electrode layer and the second electrode layer made of ferromagnetic materials, respectively.

With this configuration, it is possible to form anti-ferromagnetic domains in reverse directions at both sides of the first region 1c in advance without applying a current through the anti-ferromagnetic driving layer. In addition, with this configuration, it is possible to reduce element size.

In this exchange bias utilization type magnetoresistance effect element 300, two domains are formed such that domains of anti-ferromagnetic layers of portions of the anti-ferromagnetic driving layer 1 in contact with the first electrode layer 25 and the second electrode layer 26 reflect magnetization directions of bonded interfaces of each electrode layer. For this reason, a magnetic domain wall DW is formed between the two domains as shown in FIG. 12.

In this case, since a change in the proportion of domains by writing data corresponds to a movement of the magnetic domain wall DW, a basic idea of writing and reading data is similar to the magnetic domain wall drive type MRAM.

In the exchange bias utilization type magnetoresistance effect element of the present invention, one of the first electrode layer and the second electrode layer made of a ferromagnetic material may have a synthetic anti-ferromagnetic (SAF) structure in which a first ferromagnetic layer, an intermediate layer, and a second ferromagnetic layer are laminated.

Figure 13:
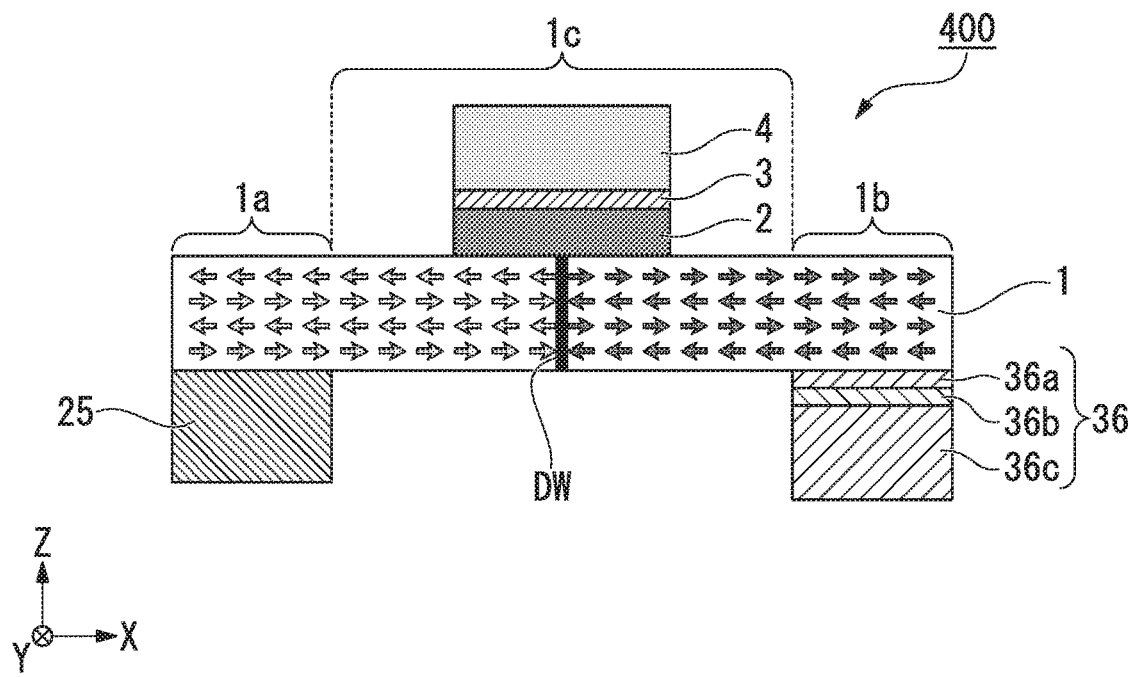
FIG. 13 is a schematic cross-sectional view of an example of the exchange bias utilization type magnetoresistance effect element according to another embodiment of the present invention.

An exchange bias utilization type magnetoresistance effect element 400 shown in FIG. 13 is different from the exchange bias utilization type magnetoresistance effect element 300 shown in FIG. 12 in that the second electrode layer 26 among the first electrode layer 25 and the second electrode layer 26 in the exchange bias utilization type magnetoresistance effect element 300 becomes an electrode 26' having the synthetic anti-ferromagnetic (SAF) structure in which the first ferromagnetic layer 26a, an intermediate layer 26b, and a second ferromagnetic layer 26c are laminated. The first ferromagnetic layer 26a is thinner than the second ferromagnetic layer 26c, and the synthetic anti-ferromagnetic structure can be a known structure.

With such a structure, it is possible to simply form anti-ferromagnetic domains in reverse directions in the anti-ferromagnetic driving layer 1 in contact with the first electrode layer and the second electrode layer by heating a magnetic field beyond a magnetic transition temperature of an anti-ferromagnetic body and performing a cooling treatment thereafter while applying the magnetic field in the same direction.

(Exchange Bias Utilization Type Magnetic Memory)

An exchange bias utilization type magnetic memory of the present invention includes a plurality of exchange bias utilization type magnetoresistance effect elements of the present invention.

As described above, the exchange bias utilization type magnetoresistance effect element included in the exchange bias utilization type magnetic memory of the present invention reverses the magnetization of the magnetic coupling layer and changes the proportion of the two types of domains in a digital manner or in an analog manner, and thereby changing the magnetoresistance in the digital manner or in the analog manner. Therefore, the exchange bias utilization type magnetic memory of the present invention can be used as a memory operating in the digital manner or as a memory operating in the analog manner.

Figure 14:
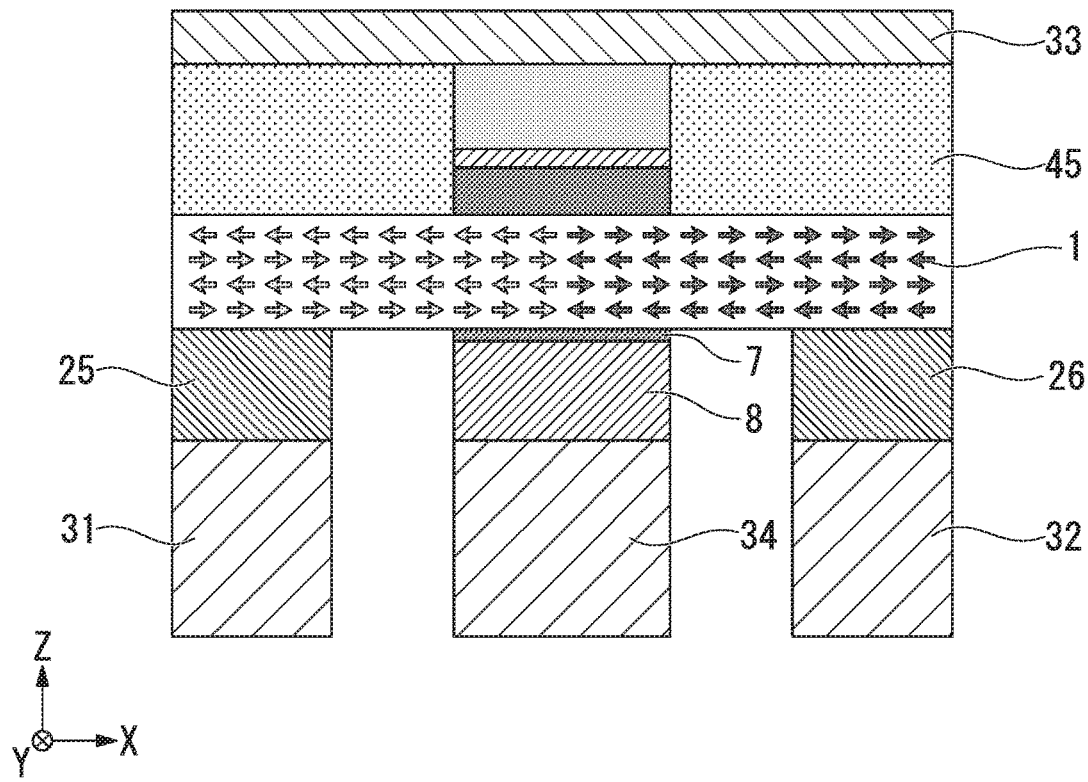
FIG. 14 is a schematic cross-sectional view of a main part of a cell in an exchange bias utilization type magnetic memory of the present invention.

FIG. 14 is a schematic cross-sectional view of a main part of a cell in an exchange bias utilization type magnetic memory.

In the exchange bias utilization type magnetoresistance effect element 100 shown in FIG. 4 and the like, a first wiring 31 and a second wiring 32 are connected to each of the first electrode layer 25 and the second electrode layer 26, a third wiring 33 is connected to the magnetization fixed layer 4, and furthermore a fourth wiring 34 is connected to a lower electrode layer 8. A reference numeral 45 is an insulating layer.

Figure 15:
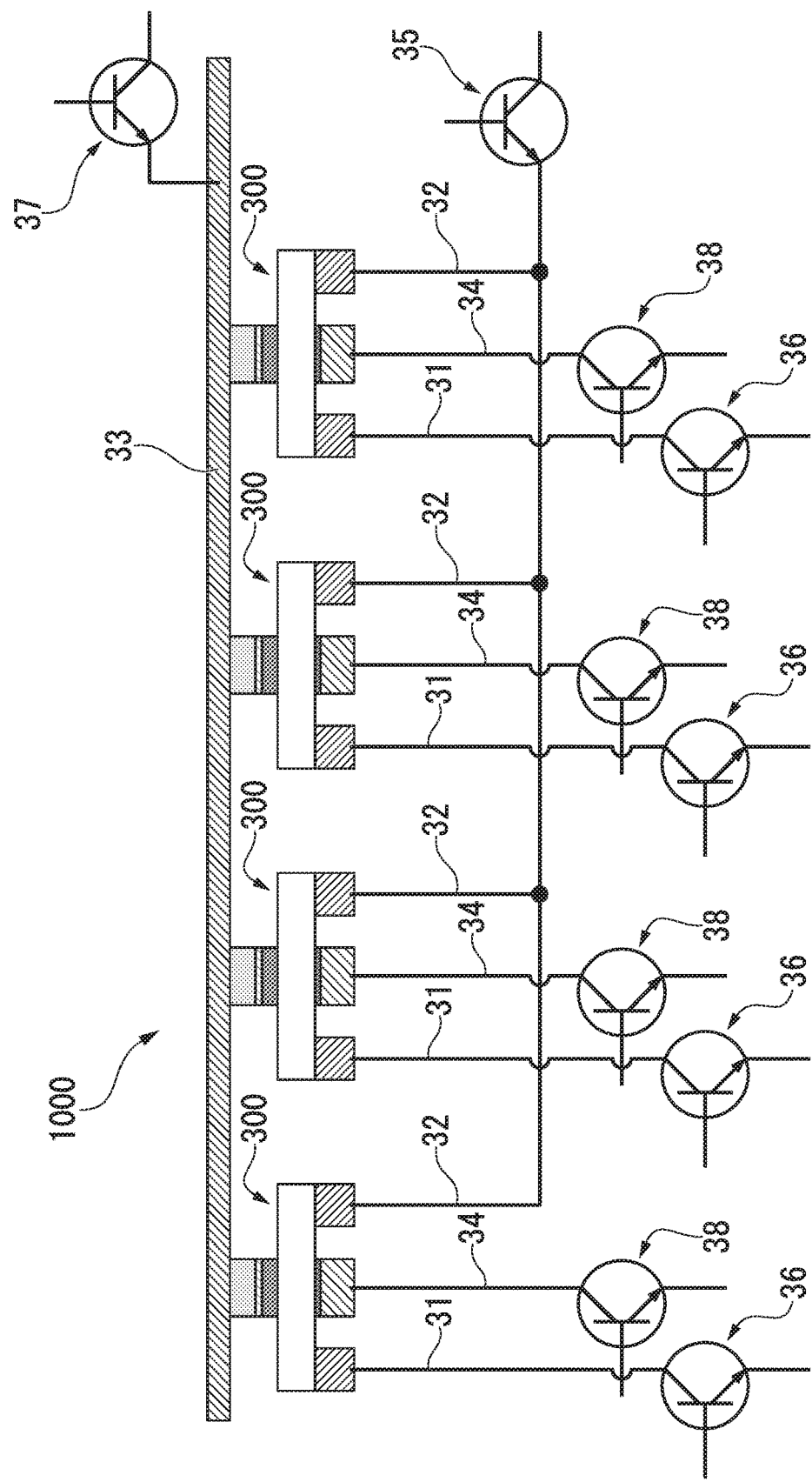
FIG. 15 is a diagram which schematically shows an example of a circuit structure of the exchange bias utilization type magnetic memory of the present invention.

FIG. 15 is a diagram which schematically shows an example of a circuit structure of the exchange bias utilization type magnetic memory 1000 according to an embodiment of the present invention.

A first control element 35 is connected to the anti-ferromagnetic driving layer 1 via the second wiring 32 of each of a plurality of exchange bias utilization type magnetoresistance effect elements 300. The first control element 35 is connected to an external power supply (not shown) and controls a current flowing into the anti-ferromagnetic driving layer 1.

A first cell selection element 36 is connected to the anti-ferromagnetic driving layer 1 via the first wiring 31 of each of the plurality of exchange bias utilization type magnetoresistance effect elements 300. The first cell selection element 36 is provided one for one exchange bias utilization type magnetoresistance effect element 300.

The first cell selection element 36 controls whether a current flows into any one of the exchange bias utilization type magnetoresistance effect elements 300. The first cell selection element 36 is grounded.

A second control element 37 is connected to the third wiring 33. The second control element 37 is connected to an external power supply (not shown) and controls a current flowing into the third wiring 33.

A second cell selection element 38 is connected to the lower electrode layer 8 via the fourth wiring 34 of each of the plurality of exchange bias utilization type magnetoresistance effect elements 300. The second cell selection element 38 is provided one for one exchange bias utilization type magnetoresistance effect element 300. The second cell selection element 38 controls whether a read current flows into any one of exchange bias utilization type magnetoresistance effect elements 300. The second cell selection element 38 is grounded.

The first control element 35, the second control element 37, the first cell selection element 36, and the second cell selection element 38 can use a known switching element. For example, a transistor element represented by a field effect transistor, or the like can be used.

The first wiring 31, the second wiring 32, the third wiring 33, and the fourth wiring 34 can use a material that is used as a normal wiring material. For example, it is possible to use aluminum, silver, copper, gold, and the like.

Hereinafter, the write operation and the read operation by the exchange bias utilization type magnetic memory 1000 will be described with reference to FIG. 15.

In the write operation, writing is controlled by the first control element 35 and the first cell selection element 36.

First, the first control element 35 is opened (connected), and the first cell selection element 36 to be opened is selected. The first control element 35 is connected to an external power supply and the first cell selection element 36 is grounded. For this reason, a write current flows in order of the first control element 35, the second wiring 32, the second electrode layer 26, the anti-ferromagnetic driving layer 1, the first wiring 31, and the selected first cell selection element 36. A description of a case of causing the current to flow in reverse will be omitted.

In the read operation, reading is controlled by the second control element 37 and the second cell selection element 38.

First, the second control element 37 is opened (connected), and the second cell selection element 38 to be opened is selected. The second control element 37 is connected to an external power supply and the second cell selection element 38 is grounded. For this reason, a read current flows in order of the second control element 37, the third wiring 33, the magnetization fixed layer, the non-magnetic layer 3, the anti-ferromagnetic driving layer 1, the lower electrode layer 8, and the selected second cell selection element 38. A description of the case of causing the current to flow in reverse will be omitted.

The second control element 37 and the second cell selection element 38 function as a read mechanism.

The exchange bias utilization type magnetic memory of the present invention may have a configuration in which any one of the first electrode layer 25 and the second electrode layer 26 is connected to a bipolar element. With such a configuration, it is possible to move the magnetic domain wall in an arbitrary direction by changing a direction of a current.

(Non-Volatile Logic Circuit)

A non-volatile logic circuit of the present invention includes an exchange bias utilization type magnetic memory in which the exchange bias utilization type magnetoresistance effect elements of the present invention are arranged in an array shape, and an STT-MRAM either inside the array or outside the array, has a storage function and a logic function, and includes the exchange bias utilization type magnetic memory and the STT-MRAM as a storage function.

Since the exchange bias utilization type magnetic memory and the STT-MRAM can be manufactured in the same process, cost can be reduced. In addition, the digital STT-MRAM is installed in the same circuit as the exchange bias utilization type magnetic memory disposed on the array, and thereby it is possible to digitalize input and output, and to form logic capable of performing analog processing therein.

(Magnetic Neuron Element)

Figure 16:
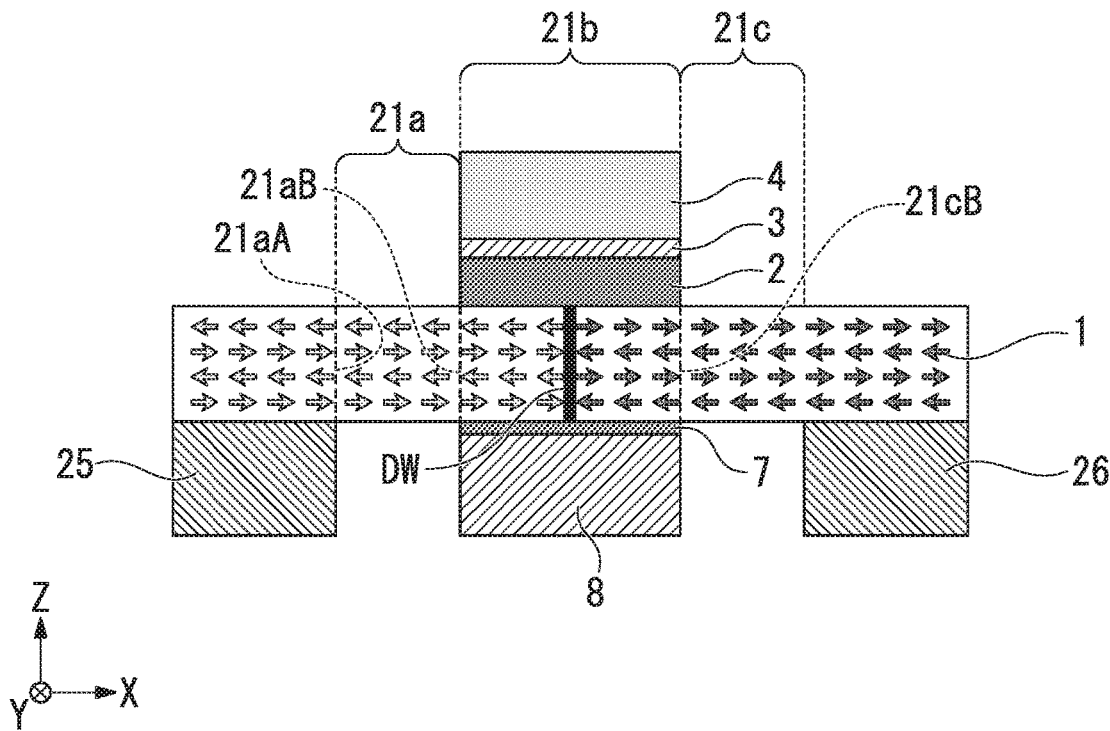
FIG. 16 is a schematic cross-sectional view of an example of a magnetic neuron element according to an embodiment of the present invention.

FIG. 16 is a schematic cross-sectional view of an example of the magnetic neuron element according to an embodiment of the present invention.

The magnetic neuron element of the present invention includes the exchange bias utilization type magnetoresistance effect element of the present invention, the third region 1c of the anti-ferromagnetic driving layer 1 aligned in a longitudinal direction and made of a first storage portion 21b, and a second storage portion 21a and a third storage portion 21c which are across the first storage portion 21b, and a current source (not shown) having a control circuit for performing control such that a write current capable of sequentially moving the magnetic domain wall flows to stay at least once in each of the first storage portion 21b, the second storage portion 21a, and the third storage portion 21c.

The first storage portion 21b is a portion of the third region 1c of the anti-ferromagnetic driving layer 1 which overlaps the magnetization fixed layer 4 in a plan view. In addition, the second storage portion 21a is a portion between the magnetization fixed layer 4 and the first electrode layer 25 in a plan view (a portion not overlapping the magnetization fixed layer 4 and the first electrode layer 25). In addition, the third storage portion 21c is a portion between the magnetization fixed layer 4 and the second electrode layer 26 in a plan view (a portion not overlapping the magnetization fixed layer 4 and the second electrode layer 26).

The exchange bias utilization type magnetic memory of the present invention can be used as a magnetic neuron element which is an element for simulating an operation of synapse. In synapse, it is preferable to have a linear output against stimuli from the outside. In addition, when a reverse direction load is given, it is preferable to reverse without hysteresis. The proportion of magnetic domains in the magnetization directions of each of the magnetization fixed layer 4 and the magnetic coupling layer 2 continuously changes depending on the proportion of the two types of domains. A parallel circuit is formed by an area of a domain (disposition with a low resistance) in which the magnetization directions of each of the magnetization fixed layer 4 and the magnetic coupling layer 2 are parallel to each other and an area of a domain (disposition with a high resistance) in which the magnetization directions are anti-parallel to each other. A horizontal axis of FIG. 9B is the proportion of the two types of domains, and can indicate a resistance change which is relatively linear. In addition, the proportion of the two types of domains can be driven depending on magnitude of a current and time of an applied current pulse. The magnitude and direction of a current, and time of the applied current pulse can be regarded as a load from the outside.

(Initial Stage of Memory)

For example, when a magnetic domain wall of the anti-ferromagnetic driving layer 1 is moved in a −X direction to a maximum level, the magnetic domain wall is stabilized at an end portion 21aA of the first electrode layer 25 on the magnetization fixed layer 4 side. If a current is caused to flow into the first electrode layer 25 from the second electrode layer 26, since a domain of the magnetic domain wall DW on the left side (hereinafter, referred to as "a first domain") is more stable in energy than a domain of the magnetic domain wall DW on the right side (hereinafter, referred to as "a second domain") in FIG. 16, reversal proceeds from the second domain to the first domain. At this time, since a second domain in the vicinity of the DW reverses with smaller energy than a second domain which is positioned away from the DW, the magnetic domain wall of the anti-ferromagnetic driving layer 1 moves in +X direction as a result. Until the magnetic domain wall reaches an end portion 21aB of the magnetization fixed layer 4 on the first electrode layer 25 side even if the magnetic domain wall moves, reading resistance does not change. This state can be called an initial stage of memory. In other words, a case in which a magnetic domain wall can be disposed in the second storage portion 21a is called an initial stage of memory. In the initial stage of memory, even if data is not recorded, it is a state in which preparation for recording data is arranged.

(Main Memory Stage)

While the magnetic domain wall passes through a lower part of the magnetization fixed layer 4 (an overlapping portion in a plan view), resistance at the time of reading changes as shown in FIB. 9B. A current is caused to flow from the second electrode layer 26 into the first electrode layer 25 to be load from the outside, and the resistance at the time of reading changes in proportion to the load to some extent. This is a main memory stage. That is, a case in which the magnetic domain wall is disposed in the first storage portion 21b can be called a main memory stage of memory. A state in which the magnetic domain wall is on an outer side than an end portion of the magnetization fixed layer 4 can be defined as a memory or non-memory state, and a state in which the magnetic domain wall is on an outer side than the end portion of the magnetization fixed layer 4 on the opposite side can be defined as a non-memory or memory state. Of course, if the current flowing between the second electrode layer 26 and the first electrode layer 25 is set to flow in a reverse direction, the opposite effect is obtained.

(Deepening Stage of Memory)

Even if the magnetic domain wall reaches an end portion 21cB of the magnetization fixed layer 4 on the second electrode layer 26 side, and moves in a direction away from the magnetization fixed layer 4, an output at the time of reading does not change. However, after the magnetic domain wall is separated from the magnetization fixed layer 4, even if a load in a reverse direction is applied, the output at the time of reading does not change until the magnetic domain wall reaches the end portion 21cB of the magnetization fixed layer 4. That is, it means that memory will not be lost even if a load is given from the outside, and this can be called a deepening stage of memory. That is, a case in which the domain wall is disposed in the third storage portion 21c can be referred to as a memory deepening stage.

If the current flowing between the second electrode layer 26 and the first electrode layer 25 is caused to flow in a reverse direction, correspondence between the initial stage of memory, the main memory stage, and the deepening stage of memory and each storage portion is reversed.

The exchange bias utilization type magnetic memory of the present invention needs to include a current source which can cause a write current to flow such that the magnetic domain wall moves through the initial stage of memory, the main memory stage, and the deepening stage of memory in order to obtain the magnetic neuron element of the present invention which is used as an element of simulating an operation of a synapse. That is, it is necessary to include at least a current source (not shown) having a control circuit which performs control such that a write current capable of moving the magnetic domain wall flows to stay at least once in all of a first storage portion, a second storage portion, and a third storage portion in order.

According to a condition of the write current, it is possible to determine the number of times of movement the magnetic domain wall passes through each of the first storage portion, the second storage portion, and the third storage portion.

(Oblivion Stage of Memory)

It is possible to forget memory by moving the magnetic domain wall of the anti-ferromagnetic driving layer 1 in the non-memory state. In addition, driving and disappearance of the domain wall can be caused by applying heat and physical distortion. In addition, since an output shows constant low resistance and high resistance values in the exchange bias utilization type magnetic memory of the present invention, the memory and non-memory states need to be determined by definition.

In addition, since a case in which the magnetic domain wall is moved or erased in a method other than causing a current to flow into the anti-ferromagnetic driving layer 1 is random, information correlation between a plurality of exchange bias utilization type magnetic memories is lost. This can be called an oblivion stage of memory.

(Artificial Brain Using Magnetic Neuron Element)

Figure 17:
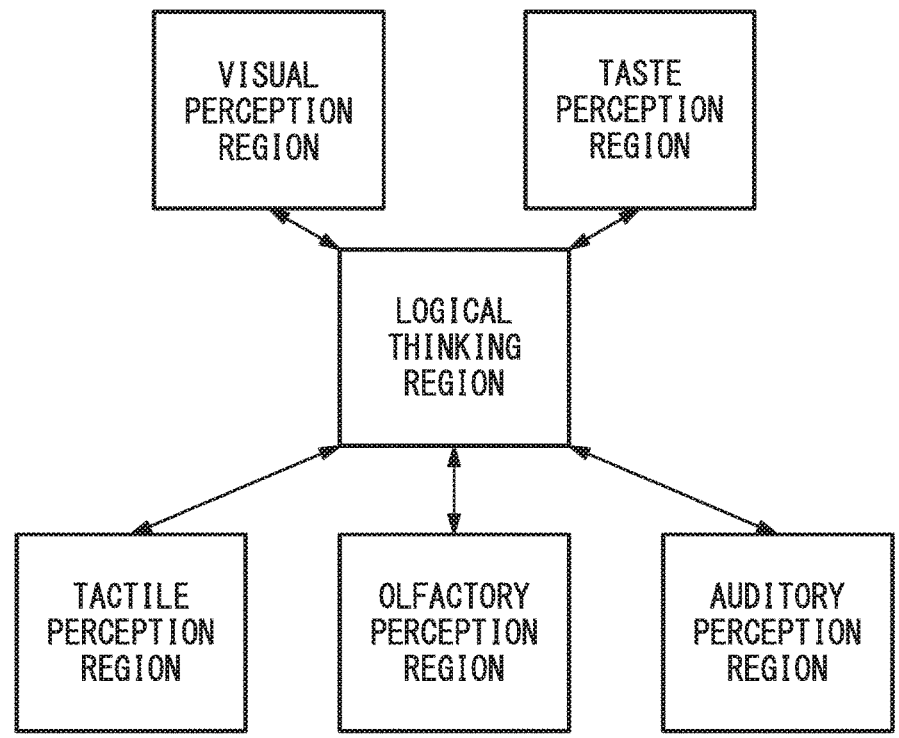
FIG. 17 is a diagram which shows a concept of an artificial brain using the magnetic neuron element according to an embodiment of the present invention.

The magnetic neuron element of the present invention is a memory which is capable of simulating the movement of a synapse and passes through the initial stage of memory, the main memory stage, and then the deepening stage of memory. It is possible to simulate a brain by installing the exchange bias utilization type magnetic memory of the present invention on a plurality of circuits. It is possible to form a brain with a high degree of integration in an arrangement that is evenly arrayed vertically and horizontally like a general memory. In addition, as shown in FIG. 17, it is possible to form brains with different degrees of recognition from external loads in an arrangement in which a plurality of magnetic neuron elements having specific circuits are arrayed as one block. For example, it is possible to create individuality such as a brain with high sensitivity for color or a brain with high understanding of language. That is, it is possible to form a process of determining a next behavior by performing recognition processing on information obtained from an external sensor in five-sensory regions optimized for visual, taste, tactile, olfactory, and auditory perception, and performing determination in a logical thinking region. Furthermore, if the material of anti-ferromagnetic driving layer 1 is changed, a method of forming a magnetic domain wall or a driving speed of the magnetic domain wall with respect to a load changes, and thus it is possible to form an artificial brain having this change as individuality.

REFERENCE SIGNS LIST

1 Anti-ferromagnetic driving layer
1a First region
1b Second region
1c Third region
2 Magnetic coupling layer
3 Non-magnetic layer
4 Magnetization fixed layer
5, 25 First electrode layer
6, 26 Second electrode layer
7 high resistance layer
8 lower electrode layer
10 Exchange bias utilization type magnetization rotational element
21a Second storage portion
21b First storage portion
21c Third storage portion
100, 200, 300, 400 Exchange bias utilization type magnetoresistance effect element
1000 Exchange bias utilization type magnetic memory

What is claimed is:

1. An exchange bias utilization type magnetization rotational element comprising:
   an anti-ferromagnetic driving layer which is made of a first region, a second region, and a third region positioned between the first and second regions;
   a magnetic coupling layer which is magnetically coupled to the anti-ferromagnetic driving layer in the third region and whose magnetization direction is variable;
   a first electrode layer which is bonded to the first region; and
   a second electrode layer which is bonded to the second region,
   wherein the anti-ferromagnetic driving layer includes, from a side bonded to the magnetic coupling layer, an anti-ferromagnetic layer and a non-magnetic metal layer which is bonded to the anti-ferromagnetic layer and in which a pure spin current is generated by a current flowing therein.

2. The exchange bias utilization type magnetization rotational element according to claim 1,
wherein the anti-ferromagnetic driving layer includes an anti-ferromagnetic material having a zinc-blende structure.

3. The exchange bias utilization type magnetization rotational element according to claim 1,
wherein the anti-ferromagnetic driving layer includes an anti-ferromagnetic material of any one of CuMnAs and $Mn_2Au$.

4. The exchange bias utilization type magnetization rotational element according to claim 1,
wherein, when a constant load amount for changing a ratio of two types of domains such as a first domain and a second domain is given, the anti-ferromagnetic driving layer is made of a material in which a change rate of the ratio with respect to the load amount discontinuously changes in the vicinity of both ends of only the first domain or the second domain.

5. The exchange bias utilization type magnetization rotational element according to claim 1,
wherein, when a constant load amount for changing a ratio of two types of domains such as a first domain and a second domain is given, the anti-ferromagnetic driving layer is made of a material in which a change rate of the ratio with respect to the load amount in the vicinity of both ends of only a first domain or a second domain is smaller than a change rate between both ends.

6. The exchange bias utilization type magnetization rotational element according to claim 1,
wherein the first electrode layer and the second electrode layer bonded to the anti-ferromagnetic driving layer are made of ferromagnetic materials having magnetization directions opposite to each other.

7. The exchange bias utilization type magnetization rotational element according to claim 6,
wherein at least one of the first electrode layer and the second electrode layer bonded to the anti-ferromagnetic driving layer is made of a synthetic anti-ferromagnetic structure in which a first ferromagnetic layer, an intermediate layer and a second ferromagnetic layer are laminated.

8. The exchange bias utilization type magnetization rotational element according to claim 1,
wherein a length of a major axis of the anti-ferromagnetic driving layer is 60 nm or more, and
a distance between a portion of the first electrode layer which is closest to the magnetic coupling layer and a portion of the second electrode layer which is closest to the magnetic coupling layer is 60 nm or more.

9. An exchange bias utilization type magnetization rotational element comprising:
an anti-ferromagnetic driving layer which is made of a first region, a second region, and a third region positioned between the first and second regions;
a magnetic coupling layer which is magnetically coupled to the anti-ferromagnetic driving layer in the third region and whose magnetization direction is variable;
a first electrode layer which is bonded to the first region;
a second electrode layer which is bonded to the second region; and
a lower electrode layer provided at a position overlapping the magnetic coupling layer in a plan view on a surface of the third region which is opposite to a surface on which the magnetic coupling layer is provided.

10. The exchange bias utilization type magnetization rotational element according to claim 9,
wherein a high resistance layer is provided between the anti-ferromagnetic driving layer and the lower electrode layer.

11. The exchange bias utilization type magnetization rotational element according to claim 9,
wherein the anti-ferromagnetic driving layer includes an anti-ferromagnetic material having a zinc-blende structure.

12. The exchange bias utilization type magnetization rotational element according to claim 9,
wherein the anti-ferromagnetic driving layer includes an anti-ferromagnetic material of any one of CuMnAs and $Mn_2Au$.

13. The exchange bias utilization type magnetization rotational element according to claim 9,
wherein the first electrode layer and the second electrode layer bonded to the anti-ferromagnetic driving layer are made of ferromagnetic materials having magnetization directions opposite to each other.

14. An exchange bias utilization type magnetoresistance effect element comprising:
an exchange bias utilization type magnetization rotational element, a non-magnetic layer bonded to the magnetic coupling layer, and a magnetization fixed layer coupled to the non-magnetic layer,
wherein the exchange bias utilization type magnetization rotational element comprises:
an anti-ferromagnetic driving layer which is made of a first region, a second region, and a third region positioned between the first and second regions:
a magnetic coupling layer which is magnetically coupled to the anti-ferromagnetic driving layer in the third region and whose magnetization direction is variable;
a first electrode layer which is bonded to the first region; and
a second electrode layer which is bonded to the second region, and
wherein the magnetic coupling layer has a laminated structure including a magnetoresistance effect layer and a soft magnetic layer in order from the side of the non-magnetic layer, and the magnetoresistance effect layer is made of a material containing CoFeB.

15. The exchange bias utilization type magnetoresistance effect element according to claim 14,
wherein a magnetization easy axis of the magnetic coupling layer and the magnetization fixed layer is perpendicular to a lamination direction.

16. The exchange bias utilization type magnetoresistance effect element according to claim 14,
wherein a bipolar element is connected to any one of the first electrode layer and the second electrode layer.

17. An exchange bias utilization type magnetic memory comprising:
a plurality of the exchange bias utilization type magnetoresistance effect elements according to claim 14.

18. The exchange bias utilization type magnetic memory according to claim 17, further comprising:
a mechanism configured to read a resistance change between the magnetization fixed layer and a lower electrode layer provided at a position overlapping the magnetic coupling layer in a plan view on a surface of the third region which is opposite to a surface on which the magnetic coupling layer is provided at the time of reading.

19. A non-volatile logic circuit comprising:
an exchange bias utilization type magnetic memory in which the exchange bias utilization type magnetoresistance effect elements according to claim 14 are arranged in an array shape, and an STT-MRAM,
wherein a storage function and a logic function are included and the exchange bias utilization type magnetic memory and the STT-MRAM are included for the storage function.

20. A magnetic neuron element comprising:
the exchange bias utilization type magnetoresistance effect element according to claim 14,
the third region of the anti-ferromagnetic driving layer aligned in a longitudinal direction and made of a first storage portion, and a second storage portion and the third storage portion which are across the first storage portion, and
a current source having a control circuit for performing control such that a write current capable of sequentially moving the magnetic domain wall flows to stay at least once in each of the first storage portion, the second storage portion, and the third storage portion.

* * * * *